(12) United States Patent
Uno

(10) Patent No.: US 8,593,205 B2
(45) Date of Patent: Nov. 26, 2013

(54) OUTPUT BUFFER CIRCUIT AND INPUT/OUTPUT BUFFER CIRCUIT

(75) Inventor: Osamu Uno, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/456,866

(22) Filed: Apr. 26, 2012

(65) Prior Publication Data
US 2012/0280740 A1 Nov. 8, 2012

(30) Foreign Application Priority Data
May 6, 2011 (JP) ................................. 2011-103561

(51) Int. Cl.
H03L 5/00 (2006.01)
(52) U.S. Cl.
USPC ........................................................ 327/333
(58) Field of Classification Search
USPC ............ 327/333; 326/68, 80, 81; 365/189.11
See application file for complete search history.

(56) References Cited

U.S. PATENT DOCUMENTS

| 5,448,198 | A | 9/1995 | Toyoshima et al. | |
|---|---|---|---|---|
| 7,180,812 | B2* | 2/2007 | Taniguchi et al. | 365/226 |
| 7,898,292 | B2 | 3/2011 | Koto | |

FOREIGN PATENT DOCUMENTS

| JP | 03-194965 | 8/1991 |
|---|---|---|
| JP | 05-335504 | 12/1993 |
| JP | 06-343034 | 12/1994 |
| JP | 08-307238 | 11/1996 |
| JP | 09-098083 | 4/1997 |
| JP | 2006-059910 | 3/2006 |
| JP | 2008-017456 | 1/2008 |

* cited by examiner

Primary Examiner — Lincoln Donovan
Assistant Examiner — Sibin Chen
(74) Attorney, Agent, or Firm — Fujitsu Patent Center

(57) ABSTRACT

An output buffer circuit includes first and second output circuits, and those output terminals are coupled to each other. The first output circuit outputs a first signal having a voltage level of a first high potential power supply or a low potential power supply and includes a first output transistor at a high potential side. The second output circuit outputs a second signal having a voltage level of a second high potential power supply, which is lower than the first high potential power supply, or the low potential power supply and includes a second output transistor at a high potential side. A control circuit sets the gate and back gate of at least one of the first and second output transistor to the voltage level of the second high potential power supply when the first high potential power supply is deactivated and the second high potential power supply is activated.

9 Claims, 15 Drawing Sheets

| State | VDD1 | VDD2 | SEL | SEL1 | V1 | V2 |
|---|---|---|---|---|---|---|
| VDD2 Activated First | OFF | ON | - | X | VDD2 | VDD2 |
| VDD1 Activated First | ON | OFF | - | 0 | VDD1 | VDD1 |
| 1st Output Circuit Operation | ON | ON | 0 | 0 | VDD1 | VDD1 |
| 2nd Output Circuit Operation | ON | ON | 1 | 1 | VDD1 | VDD2 |

(-: Don't care)  (X: Indefinite)

OUTPUT BUFFER CIRCUIT AND INPUT/OUTPUT BUFFER CIRCUIT

CROSS-REFERENCE TO RELATED APPLICATIONS

This application is based upon and claims the benefit of priority from prior Japanese Patent Application No. 2011-103561, filed on May 6, 2011, the entire contents of which are incorporated herein by reference.

FIELD

The present application relates to an output buffer circuit and an input/output buffer circuit.

BACKGROUND

There is a trend for driving semiconductor devices with lower voltages to decrease power consumption. However, there are still semiconductor devices that are not driven by lower voltages and semiconductor devices of which drive voltages may not be lowered. As a result, recent semiconductor devices are provided with an interface that is applicable for external semiconductor devices actuated by different power supply voltages. Such a semiconductor device includes an output buffer circuit that switches a signal to different potentials in accordance with an operational power supply voltage of the external semiconductor device (refer to, for example, Japanese Laid-Open Patent Publication No. 6-343034).

FIG. 1 illustrates one example of an output buffer circuit 2 of the related art.

The output buffer circuit 2 includes a first output circuit 80, which outputs a signal with a first high potential power supply VDD1, and a second output circuit 90, which outputs a signal with a second high potential power supply VDD2. The voltage of the second high potential power supply VDD2 is lower than the voltage of the first high potential power supply VDD1. An output terminal of the first output circuit 80 and an output terminal of the second output circuit 90 are coupled to an output terminal To.

The first output circuit 80 includes a buffer circuit 81, which operates with the first high potential power supply VDD1, and an output driver 82, which is driven by the buffer circuit 81. In the first output circuit 80, when a control signal SEL has an L level, the output driver 82 activates one of output transistors T81 and T82 in accordance with the level of a signal Do to output a signal having the level of the first high potential power supply VDD1 or the level of a lower potential power supply VSS. When the control signal SEL has an H level, the output driver 82 deactivates both of the output transistors T81 and T82 to place an output node N1A between the output transistors T81 and T82 in a high impedance state.

The second output circuit 90 includes a buffer circuit 91, which operates with the first high potential power supply VDD1, and an output driver 92, which is driven by the buffer circuit 91. In the second output circuit 90, when the control signal SEL has an H level, the output driver 92 activates one of output transistors T91 and T92 in accordance with the level of the signal Do to output a signal having the level of the second high potential power supply VDD2, which is lower than the level of the first high potential power supply VDD1, or the level of a lower potential power supply VSS. When the control signal SEL has an L level, the output driver 92 deactivates both of the output transistors T91 and T92 to place an output node N2A between the output transistors T91 and T92 in a high impedance state.

When the output node N2A is in a high impedance state, the back gate voltage and gate voltage of the output transistor T91 are set at the level of the first high potential power supply VDD1 so that current does not flow to the output transistor T91. For example, when an output signal of the first output circuit 80 has the level of the first high potential power supply VDD1, since the output terminals of the first and second output circuits 80 and 90 are coupled to the output terminal To, the output signal of the first output circuit 80 is applied to the drains of the output transistors T91 and T92 of the second output circuit 90. In this state, when the back gate of the output transistor T91, which is a P-channel MOS transistor, is coupled to, for example, the second high potential power supply VDD2, the potential at the back gate becomes lower than the potential at the drain. This forms a diode in a forward direction from the drain to the back gate, and current flows to the output transistor T91. Thus, the level of the signal having the highest potential output to the output terminal To (here, the level of the first high potential power supply VDD1) is set as the back gate voltage of the output transistor T91. This prevents current from flowing to the output transistor T91 when the output node N2A is in a high impedance state.

When a signal having the level of the first high potential power supply VDD1 is output from the first output circuit 80 and a signal having the level of the second high potential power supply VDD2 is supplied to the gate of the output transistor T91, the output transistor T91 is activated by the relationship of the potentials at the source, drain, and gate of the output transistor T91. As a result, current flows from the first high potential power supply VDD1 via the output transistor T91 to the second high potential power supply VDD2. Thus, the operational power for the buffer circuit 91 of the second output circuit 90 is set to the first high potential power supply VDD1, and the gate of the output transistor T91 is provided with a signal having the level of the first high potential power supply VDD1. This prevents current from flowing to the output transistor T91 when the output node N2A is in a high impedance state.

However, the second high potential power supply VDD2 may be activated before the first high potential power supply VDD1. In such a case, the first high potential power supply VDD1 is deactivated. Thus, the back gate voltage and gate voltage of the output transistor T91 are not controlled as described above. Namely, the first high potential power supply VDD1 is 0 V. Thus, the gate of the output transistor T91 is provided with a signal having an L level. In this state, the source of the output transistor T91 is coupled to the second high potential power supply VDD2. Thus, the output transistor T91 is activated. This applies a signal having the level of the second high potential power supply VDD2 to the drain of the output transistor T81. At the same time, the gate of the output transistor T81 is provided with a signal having an L level. Thus, the output transistor T81 is also activated. As a result, inflow current flows from the second high potential power supply VDD2 to the first high potential power supply VDD1 (the first high potential power supply VDD1 coupled to the back gate of the output transistor T91 and the first high potential power supply VDD1 coupled to the source of the output transistor T81). This changes the power supply voltage.

SUMMARY

According to one aspect, an output buffer circuit includes a first output circuit, a second output circuit, and a control circuit. The first output circuit outputs a first signal having a voltage level of a first high potential power supply or a low potential power supply. The first output circuit includes a first output transistor at a high potential side, and the first output transistor includes a gate and a back gate. The second output circuit outputs a second signal having a voltage level of a second high potential power supply, which is lower than the first high potential power supply, or the low potential power supply. An output terminal of the second output circuit is coupled to an output terminal of the first output circuit and includes a second output transistor at a high potential side, and the second output transistor includes a gate and a back gate. The control circuit sets the gate and back gate of at least one of the first output transistor and the second output transistor to the voltage level of the second high potential power supply when the first high potential power supply is deactivated and the second high potential power supply is activated.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which.

DESCRIPTION OF THE EMBODIMENTS

Figure 1:
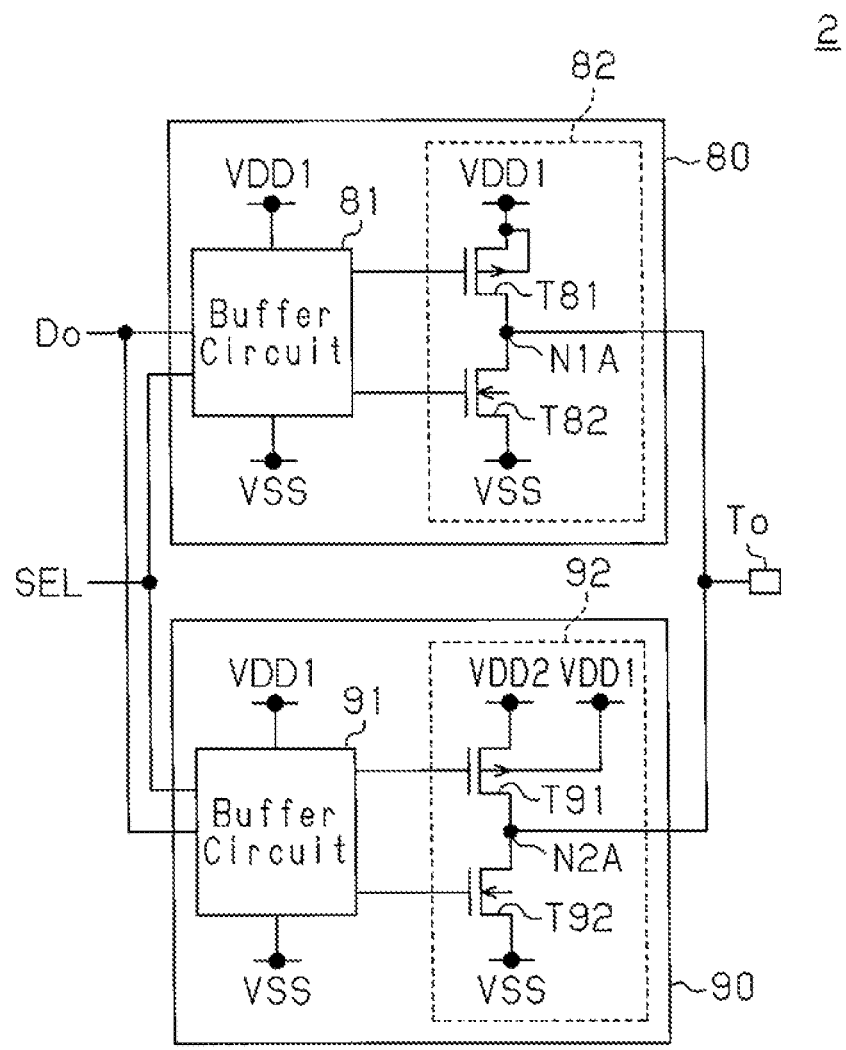
FIG. 1 is a block circuit diagram illustrating an output buffer circuit in the related art.

One embodiment will now be described with reference to FIGS. 2 to 12.

An output buffer circuit 1 includes a first output circuit 10 and a second output circuit 20, which are coupled to an output terminal To. An output terminal of the first output circuit 10 and an output terminal of the second output circuit 20 are coupled to an output terminal To. The first output circuit 10 outputs a signal having a voltage level of a first high potential power supply VDD1 or a low potential power supply VSS. The second output circuit 20 outputs a signal having a voltage level of a second high potential power supply VDD2, the voltage of which is lower than the voltage of the first high potential power supply VDD1, or the low potential power supply VSS. The first and second high potential power supplies VDD1 and VDD2 are set to voltage values that are in accordance with the operational power supply voltages of other semiconductor devices (that is, operational voltage of the input circuit) coupled to the output buffer circuit 1. For example, the first high potential power supply VDD1 is 3.3 V, the second high potential power supply VDD2 is 1.8 V, and the low potential power supply VSS is 0 V.

In the output buffer circuit 1, an internal circuit (not illustrated) provides the buffer circuit 30 with a signal Do having a level that is in accordance with the operational voltage of the internal circuit. In the present embodiment, the operational voltage of the internal circuit is set at a voltage value of the second high potential power supply VDD2 or a third high potential power supply (not illustrated), which is lower than the second high potential power supply VDD2. The voltage of the third high potential power supply is generated from the first high potential power supply VDD1 or the second high potential power supply VDD2 by, for example, a step-down regulator. The buffer circuit 30 includes a power supply terminal, which is coupled to the first high potential power supply VDD1, and a power supply terminal, which is coupled to the low potential power supply VSS. When the buffer circuit 30 receives a signal Do having a voltage level of the second high potential power supply VDD2 or the third high potential power supply, the buffer circuit 30 outputs a signal Do1 having the voltage level of the first high potential power supply VDD1. Further, when the buffer circuit 30 receives a signal Do having a voltage level of the low potential power supply VSS, the buffer circuit 30 outputs a signal Do1 having the voltage level of the low potential power supply VSS. For the sake of brevity, in the description hereafter, the voltage level of the first high potential power supply VDD1 will be referred to as the "VDD1 level" or the "H1 level", and the voltage level of the second high potential power supply VDD2 will be referred to as the "VDD2 level" or the "H2 level". Further, the voltage level of the third high potential power supply will be referred to as the "VDD3 level" or the "H3 level", and the voltage level of the low potential power supply VSS will be referred to as the "VSS level" or the "L level".

In the output buffer circuit 1, a control signal SEL output from the internal circuit is provided to the buffer circuit 40. The buffer circuit 40 includes a power supply terminal coupled to the first high potential power supply VDD1 and a power supply terminal coupled to the low potential power supply VSS. When the buffer circuit 40 receives a control signal SEL having the H2 level or H3 level, the buffer circuit 40 outputs a control signal SEL1 having the H1 level. When the buffer circuit 40 receives a control signal SEL having the L level, the buffer circuit 40 outputs a control signal SEL1 having the L level. The control signal SEL (SEL1) is a signal that selectively actuates (activates) either one of the first output circuit 10 and the second output circuit 20. Thus, either one of the first and second output circuits 10 and 20 perform a signal output operation based on the control signal SEL (SEL1). In this example, the first output circuit 10 performs a signal output operation based on a control signal SEL1 having the L level, and the second output circuit 20 performs a signal output operation based on a control signal SEL1 having the H1 level.

Figure 3:
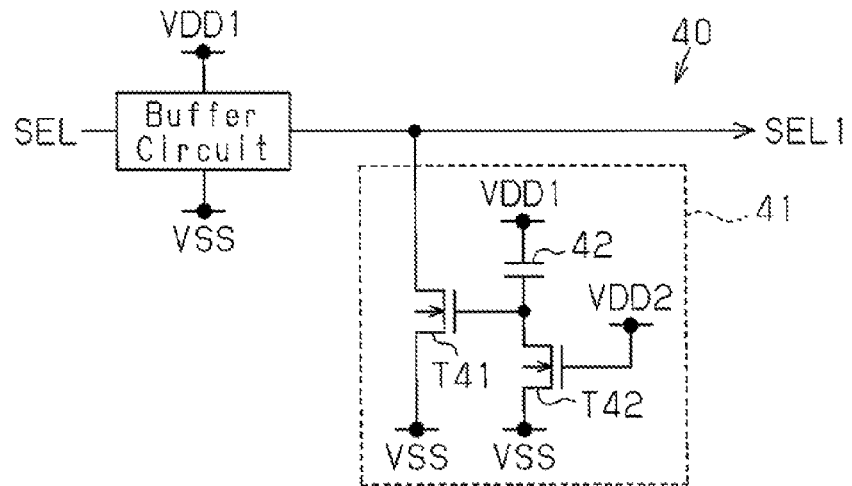
FIG. 3 is a circuit diagram illustrating an example of an initial value setting circuit.

The buffer circuit 40 includes an initial value setting circuit 41, which generates the control signal SEL1. FIG. 3 illustrates one example of the initial value setting circuit 41. In this example, the initial value setting circuit 41 sets the control signal SEL1 to the L level when the first high potential power supply VDD1 is activated before the second high potential power supply VDD2.

The initial value setting circuit 41 includes an N-channel MOS transistor T41 and an N-channel MOS transistor T42. The transistor T41 includes a source coupled to the low potential power supply VSS, a drain coupled to the output terminal of the buffer circuit 40, and a gate coupled to a first terminal of a capacitor 42. The capacitor 42 includes a second terminal coupled to the first high potential power supply VDD1. The transistor T42 includes a source coupled to the low potential power supply VSS, a drain coupled to the gate of the transistor T41, and a gate coupled to the second high potential power supply VDD2.

In the initial value setting circuit 41, when the first high potential power supply VDD1 is activated before the second high potential power supply VDD2 and the second high potential power supply VDD2 is 0 V, or has the L level, the transistor T42 is deactivated. In this state, the second terminal of the capacitor 42 is coupled to the first high potential power supply VDD1. Thus, the first terminal of the capacitor 42 has the VDD1 level. This activates the transistor T41. As a result, the transistor T41 sends a control signal SEL1 having the VSS level (L level) to the output terminal of the buffer circuit 40. Then, when the second high potential power supply VDD2 is activated, the transistor T42 is activated and the gate of the transistor T41 is coupled to the low potential power supply VSS. This deactivates the transistor T41. As a result, the output terminal of the buffer circuit 40 is decoupled from the initial value setting circuit 41.

Figure 2:
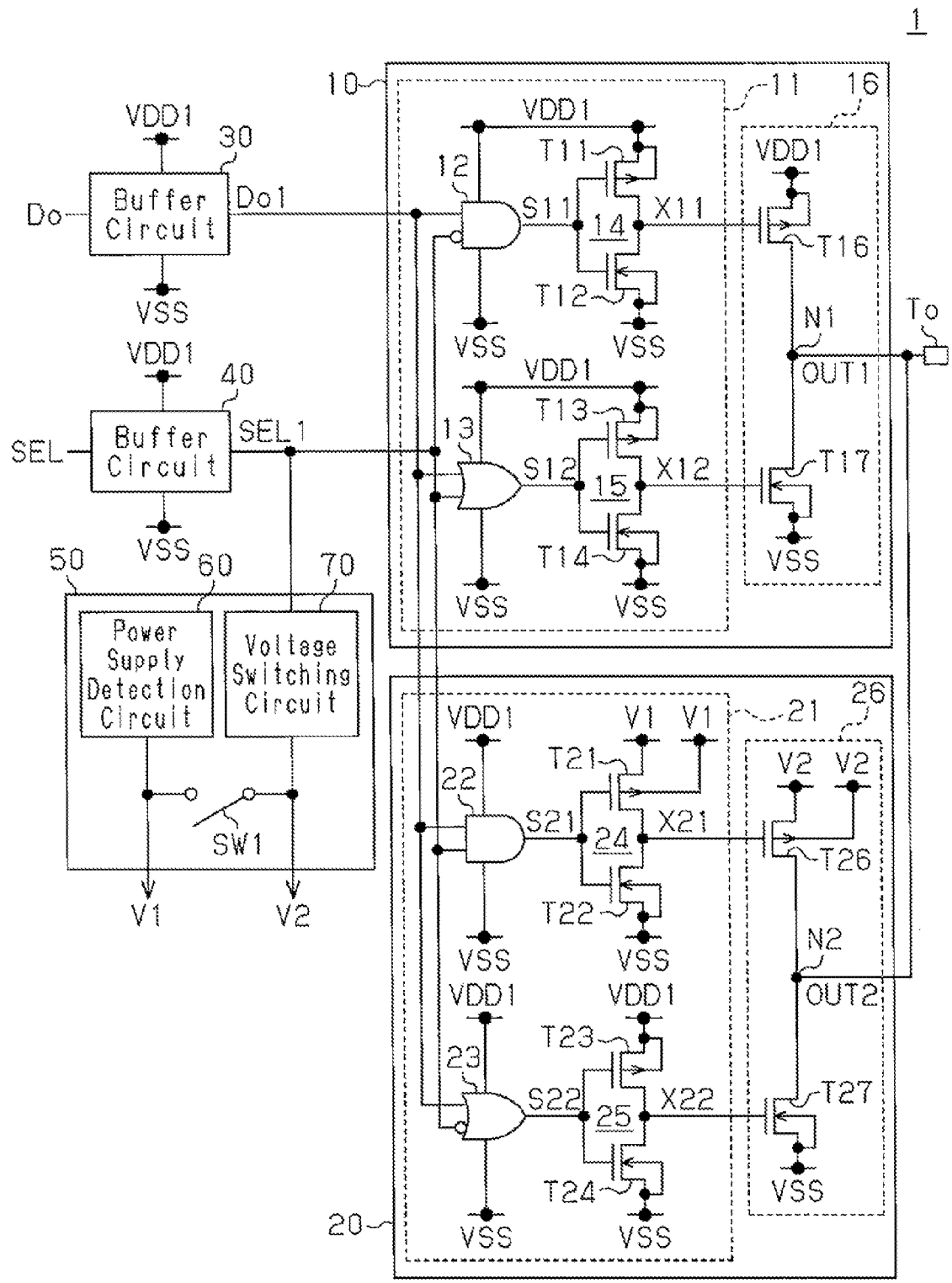
FIG. 2 is a block circuit diagram illustrating one embodiment of an output buffer circuit.

As illustrated in FIG. 2, the output buffer circuit 1 includes a control circuit 50, which is provided with the control signal SEL1. The control circuit 50 includes a power supply detection circuit 60 that detects activation of the first high potential power supply VDD1 and activation of the second high potential power supply VDD2. In accordance with the order of activation of the power supplies VDD1 and VDD2, the power supply detection circuit 60 generates a first control voltage V1 having the VDD1 level or the VDD2 level. When the second high potential power supply VDD2 is activated before the first high potential power supply VDD1, the power supply detection circuit 60 sets the first control voltage V1 to the VDD2 level. When the first high potential power supply VDD1 is activated before the second high potential power supply VDD2, the power supply detection circuit 60 sets the first control voltage V1 to the VDD1 level. When the first and second high potential power supplies VDD1 and VDD2 are both activated, the power supply detection circuit 60 generates the first control voltage V1 at the VDD1 level.

The control circuit 50 also includes a voltage switching circuit 70 that generates a second control voltage V2 having the VDD1 level or the VDD2 level in accordance with the control signal SEL1. When the voltage switching circuit 70 receives a control signal SEL1 having the L level in a state in which the high potential power supplies VDD1 and VDD2 are both activated, that is, when the first output circuit 10 is selectively actuated, the voltage switching circuit 70 sets the second control voltage V2 to the VDD1 level. When the voltage switching circuit 70 receives a control signal SEL1 having the H1 level in a state in which the high potential power supplies VDD1 and VDD2 are both activated, that is, when the second output circuit 20 is selectively actuated, the voltage switching circuit 70 sets the second control voltage V2 to the VDD2 level.

Further, the control circuit 50 includes a switch circuit SW1 that selectively couples and decouples an output terminal of the power supply detection circuit 60 and an output terminal of the voltage switching circuit 70. The activation and deactivation of the switch circuit SW1 are controlled in accordance with the activation state of the two power supplies VDD1 and VDD2 and the control signal SEL1. In this example, in a state in which one of the first and second high potential power supplies VDD1 and VDD2 is activated, the switch circuit SW1 is activated. When the first and second high potential power supplies VDD1 and VDD2 are both activated, the switch circuit SW1 is deactivated by a control signal SEL1 having the H1 level and activated by a control signal SEL1 having the L level.

An example of the configuration of the first output circuit 10 will now be described.

The first output circuit 10 includes a buffer circuit 11 and an output driver 16. An example of the configuration of the buffer circuit 11 will now be described.

Logic circuits 12 and 13 are provided with the signal Do1 from the buffer circuit 30 and the control signal SEL1 from the buffer circuit 40. Each of the logic circuits 12 and 13 includes a power supply terminal coupled to the first high potential power supply VDD1 and a power supply terminal coupled to the low potential power supply VSS. The logic circuit 12 performs a logical AND operation on the signal Do1 and an inverted level of the control signal SEL1 to generate an output signal S11 indicating the operation result. Thus, when the control signal SEL1 has the L level, the logic circuit 12 outputs the signal Do1 as the output signal S11. When the control signal SEL1 has the H1 level, the logic circuit 12 outputs the output signal S11 with the L level regardless of the level of the signal Do1. The output signal S11 is provided to an inverter circuit 14. The logic circuit 13 performs a logical OR operation on the signal Do1 and the control signal SEL1 to generate an output signal S12 indicating the operation result. Thus, when the control signal SEL1 has the L level, the logic circuit 13 outputs the signal Do1 as the output signal S12. When the control signal SEL1 has the H1 level, the logic circuit 13 outputs the output signal S12 with the H1 level regardless of the level of the signal Do1. The output signal S12 is provided to an inverter circuit 15.

The inverter circuit 14 logically inverts the output signal S11 of the logic circuit 12 to generate an inverted signal X11. The inverted signal X11 is provided to the gate of an output transistor T16 arranged in the output driver 16. The inverter circuit 14 includes a P-channel MOS transistor T11 and an N-channel MOS transistor T12, which are coupled in series between the first high potential power supply VDD1 and the low potential power supply VSS. The output signal S11 of the logic circuit 12 is provided to the gates of the transistors T11 and T12. The transistor T11 includes a back gate coupled to the first high potential power supply VDD1. The transistor T12 includes a back gate coupled to the low potential power supply VSS. A node between the transistors T11 and T12, that is, an output terminal of the inverter circuit 14, is coupled to the gate of the output transistor T16.

The inverter circuit 15 logically inverts the output signal S12 of the logic circuit 13 to generate an inverted signal X12. The inverted signal X12 is provided to the gate of an output transistor T17 arranged in the output driver 16. The inverter circuit 15 includes a P-channel MOS transistor T13 and an N-channel MOS transistor T14, which are coupled in series between the first high potential power supply VDD1 and the low potential power supply VSS. The output signal S12 of the logic circuit 13 is provided to the gates of the transistors T13 and T14. The transistor T13 includes a back gate coupled to the first high potential power supply VDD1. The transistor T14 includes a back gate coupled to the low potential power supply VSS. A node between the transistors T13 and T14, that is, an output terminal of the inverter circuit 15, is coupled to the gate of the output transistor T17.

An example of the configuration of the output driver 16 will now be described.

The output transistor T16 is a P-channel MOS transistor, and the output transistor T17 is an N-channel MOS transistor. The source and back gate of the output transistor T16 are coupled to the first high potential power supply VDD1. The drain of the output transistor T16 is coupled to the drain of the output transistor T17. The source and back gate of the output transistor T17 are coupled to the low potential power supply VSS. An output node N1 between the output transistors T16 and T17 is coupled to the output terminal To.

As described above, the first output circuit 10 performs a signal output operation based on the L level of the control signal SEL (i.e., L level of the control signal SEL1). When the control signal SEL1 has the L level, the first output circuit 10 activates one of the output transistors T16 and T17 in accordance with the level of the signal Do to output an output signal OUT1 having the VDD1 level or the VSS level. When the control signal SEL has the H2 level or the H3 level (i.e., when the control signal SEL1 has the H1 level), the first output circuit 10 deactivates both of the output transistors T16 and T17 to place the output node N1 between the output transistors T16 and T17 in a high impedance state.

An example of the configuration of the second output circuit 20 will now be described.

The second output circuit 20 includes a buffer circuit 21 and an output driver 26. An example of the configuration of the buffer circuit 21 will now be described.

Logic circuits 22 and 23 are provided with the signal Do1 from the buffer circuit 30 and the control signal SEL1 from the buffer circuit 40. Each of the logic circuits 22 and 23 includes a power supply terminal coupled to the first high potential power supply VDD1 and a power supply terminal coupled to the low potential power supply VSS. The logic circuit 22 performs a logical AND operation on the signal Do1 and the control signal SEL1 to generate an output signal S21 indicating the operation result. Thus, when the control signal SEL1 has the H1 level, the logic circuit 22 outputs the signal Do1 as the output signal S21. When the control signal SEL1 has the L level, the logic circuit 22 outputs the output signal S21 with the L level regardless of the level of the signal Do1. The output signal S21 is provided to an inverter circuit 24. The logic circuit 23 performs a logical OR operation on the signal Do1 and an inverted level of the control signal SEL1 to generate an output signal S22 indicating the operation result. Thus, when the control signal SEL1 has the H1 level, the logic circuit 23 outputs the signal Do1 as the output signal S22. When the control signal SEL1 has the L level, the logic circuit 23 outputs the output signal S22 with the H1 level regardless of the level of the signal Do1. The output signal S22 is provided to an inverter circuit 25.

The inverter circuit 24 logically inverts the output signal S21 of the logic circuit 22 to generate an inverted signal X21. The inverted signal X21 is provided to the gate of an output transistor T26 arranged in the output driver 26. The inverter circuit 24 outputs the inverted signal X21 having the level of the first control voltage V1 when the output signal S21 has the L level. The inverter circuit 24 outputs the inverted signal X21 having the L level when the output signal S21 has the H1 level. The inverter circuit 24 includes a P-channel MOS transistor T21 and an N-channel MOS transistor T22, which are coupled in series. The output signal S21 of the logic circuit 22 is provided to the gates of the transistors T21 and T22. The source and back gate of the transistor T21 is supplied with the first control voltage V1, which is generated by the control circuit 50. The drain of the transistor T21 is coupled to the drain of the transistor T22. The source and back gate of the transistor T22 are coupled to the low potential power supply VSS. A node between the transistors T21 and T22, that is, an output terminal of the inverter circuit 24, is coupled to the gate of the output transistor T26.

The inverter circuit 25 logically inverts the output signal S22 of the logic circuit 23 to generate an inverted signal X22. The inverted signal X22 is provided to the gate of an output transistor T27 arranged in the output driver 26. The inverter circuit 25 includes a P-channel MOS transistor T23 and an N-channel MOS transistor T24, which are coupled in series between the first high potential power supply VDD1 and the low potential power supply VSS. The output signal S22 of the logic circuit 23 is provided to the gates of the transistors T23 and T24. The transistor T23 includes a back gate coupled to the first high potential power supply VDD1. The transistor T24 includes a back gate coupled to the low potential power supply VSS. A node between the transistors T23 and T24, that is, an output terminal of the inverter circuit 25, is coupled to the gate of the output transistor T27.

An example of the configuration of the output driver 26 will now be described.

The output transistor T26 is a P-channel MOS transistor, and the output transistor T27 is an N-channel MOS transistor. The source and back gate of the output transistor T26 are supplied with the second control voltage V2, which is generated by the control circuit 50. The drain of the output transistor T26 is coupled to the drain of the output transistor T27. The source and back gate of the output transistor T27 are coupled to the low potential power supply VSS. An output node N2 between the output transistors T26 and T27 is coupled to the output terminal To.

As described above, the second output circuit 20 performs a signal output operation based on the H2 level or H3 level of the control signal SEL (i.e., H1 level of the control signal SEL1). When the control signal SEL1 has the H1 level, the second output circuit 20 activates one of the output transistors T26 and T27 in accordance with the level of the signal Do to output an output signal OUT2 having the level of the second control voltage V2 (here, the VDD2 level) or the VSS level. When the control signal SEL has the L level (i.e., when the control signal SEL1 has the L level), the second output circuit 20 deactivates both of the output transistors T26 and T27 to place the output node N2 between the output transistors T26 and T27 in a high impedance state.

The inverter circuit 14 is one example of a buffer circuit that drives a first output transistor, the output transistor T16 is one example of a first output transistor, the inverter circuit 24 is one example of a buffer circuit that drives a second output transistor, and the output transistor T26 is one example of a second output transistor. The initial value setting circuit 41 is one example of a setting circuit, the output signal OUT1 is one example of a first signal, and the output signal OUT2 is one example of a second signal.

An example of the configuration of the power supply detection circuit 60 in the control circuit 50 will now be described with reference to FIG. 4.

An inverter circuit 61 includes an input terminal coupled to the first high potential power supply VDD1, a power supply terminal coupled to the second high potential power supply VDD2, a power supply terminal coupled to the low potential power supply VSS, and an output terminal.

A P-channel MOS transistor T61 includes a gate coupled to the output terminal of the inverter circuit 61, a back gate, a first terminal (e.g., source) coupled to the first high potential power supply VDD1, and a second terminal (e.g., drain) coupled to the back gate of the transistor T61. A P-channel MOS transistor T62 includes a gate coupled to the first high potential power supply VDD1, a back gate, a first terminal (e.g., source) coupled to the second terminal of the transistor T61 and the back gate of the transistor T62, and a second terminal (e.g., drain) coupled to the second high potential power supply VDD2. A node between the transistors T61 and T62 is coupled to an output terminal of the power supply detection circuit 60 from which the first control voltage V1 is output.

In the power supply detection circuit 60, when the first high potential power supply VDD1 is activated before the second high potential power supply VDD2, the inverter circuit 61 outputs a signal having the L level. The L level signal activates the transistor T61. Thus, the first control voltage V1 is generated with the VDD1 level. When the second high potential power supply VDD2 is activated before the first high potential power supply VDD1, the first high potential power supply VDD1 is 0 V, or the L level. Thus, the inverter circuit 61 outputs a signal having the VDD2 level. The signal having the VDD2 level deactivates the transistor T61. In this state, the transistor T62 is activated by the L level high potential power supply VDD1. Thus, the first control voltage V1 is generated with the VDD2 level. Further, when the first and second high potential power supplies VDD1 and VDD2 are both activated, the inverter circuit 61 outputs a signal having the L level. The L level signal activates the transistor T61. Thus, the first control voltage V1 is generated with the VDD1 level.

Figure 5:
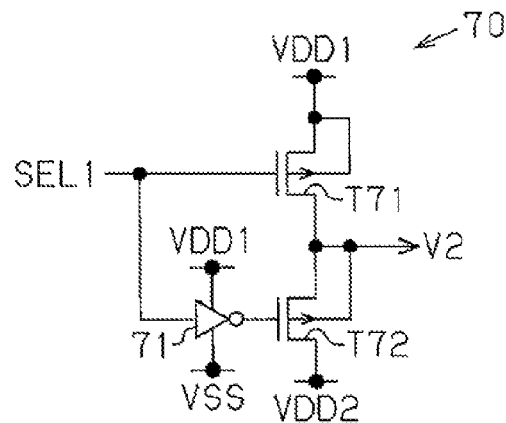
FIG. 5 is a circuit diagram illustrating an example of a voltage switching circuit.

An example of the configuration of the voltage switching circuit 70 will now be described with reference to FIG. 5.

A P-channel MOS transistor T71 includes a gate that receives the control signal SEL1, a back gate coupled to the first high potential power supply VDD1, a first terminal (e.g., source) coupled to the back gate, and a second terminal (e.g., drain).

An inverter circuit 71 includes a power supply terminal coupled to the first high potential power supply VDD1, a power supply terminal coupled to the low potential power supply VSS, an input terminal that receives the control signal SEL1, and an output terminal. A P-channel MOS transistor T72 includes a gate coupled to the output terminal of the inverter circuit 71, a back gate, a first terminal (e.g., source) coupled to the back gate of the transistor T72 and the second terminal of the transistor T71, and a second terminal (e.g., drain) coupled to the second high potential power supply VDD2.

A node between the transistors T71 and T72 is coupled to an output terminal of the voltage switching circuit 70. The second control voltage V2 is output from the output terminal of the voltage switching circuit 70.

In the voltage switching circuit 70, when the control signal SEL1 has the L level, the transistor T71 is activated. In this state, the inverter circuit 71 outputs a signal having the VDD1 level. This deactivates the transistor T72. As a result, the second control voltage V2 is generated with the VDD1 level. When the control signal SEL1 has the H1 level (VDD1 level), the transistor T71 is deactivated. In this state, the inverter circuit 71 outputs a signal having the L level. This activates the transistor T72. As a result, the second control voltage V2 is generated with the VDD2 level.

An example of the configuration of the control circuit 50, which includes the power supply detection circuit 60, the voltage switching circuit 70, and the switch circuit SW1, will now be described with reference to FIG. 6.

A P-channel MOS transistor T51 includes a gate that receives the control signal SEL1 from the buffer circuit 40, a first terminal (e.g., source) coupled to the first high potential power supply VDD1, a second terminal (e.g., drain), and a back gate coupled to a first output terminal P1. The control signal SEL1 output from the buffer circuit 40 is also provided to an input terminal of an inverter circuit 51.

An inverter circuit 52 includes a power supply terminal coupled to the second high potential power supply VDD2, a power supply terminal coupled to the low potential power supply VSS, an input terminal coupled to the first high potential power supply VDD1, and an output terminal.

A P-channel MOS transistor T52 includes a gate coupled to the output terminal of the inverter circuit 52, a first terminal (e.g., source) coupled to the second terminal of the transistor T51, a second terminal (e.g., drain), and a back gate coupled to the second terminal of the transistor T52. A P-channel MOS transistor T53 includes a gate coupled to the first high potential power supply VDD1, a first terminal (e.g., source) coupled to the second terminal of the transistor T52, a second terminal (e.g., drain) coupled to the second high potential power supply VDD2, and a back gate coupled to the first terminal of the transistor T53. A node between the transistors T52 and T53 is coupled to a second output terminal P2.

A P-channel MOS transistor T54 includes a gate coupled to the output terminal of the inverter circuit 52, a first terminal (e.g., source) coupled to the first high potential power supply VDD1, a second terminal (e.g., drain), and a back gate coupled to the second terminal of the transistor T54. A P-channel MOS transistor T55 includes a gate coupled to the first high potential power supply VDD1, a first terminal (e.g., source) coupled to the second terminal of the transistor T54, a second terminal (e.g., drain), and a back gate coupled to the first terminal of the transistor T55. A node between the transistors T54 and T55 is coupled to the first output terminal P1 from which the first control voltage V1 is output.

The inverter circuit 51 includes a power supply terminal coupled to the first high potential power supply VDD1, a power supply terminal coupled to the low potential power supply VSS, the input terminal that receives the control signal SEL1 from the buffer circuit 40, and an output terminal. A P-channel MOS transistor T56 includes a gate coupled to the output terminal of the inverter circuit 51, a first terminal (e.g., source) coupled to the second terminal of the transistor T55, a second terminal (e.g., drain) coupled to the second high potential power supply VDD2, and a back gate coupled to the first terminal of the transistor T56. A node between the transistors T55 and T56 is coupled to the second output terminal P2 from which the second control voltage V2 is output.

Figure 4:
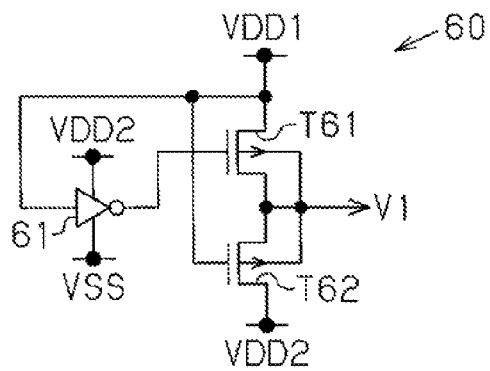
FIG. 4 is a circuit diagram illustrating an example of a power supply detection circuit.

In the control circuit 50, the inverter circuit 52 and the transistors T53 and T54 respectively correspond to the inverter circuit 61 and the transistors T62 and T61, which are illustrated in FIG. 4, and function as the power supply detection circuit 60. The inverter circuit 51 and the transistors T51 and T56 respectively correspond to the inverter circuit 71 and the transistors T71 and T72, which are illustrated in FIG. 5, and function as the voltage switching circuit 70. Further, the transistor T55, which is coupled between the transistors T53 and T54, and the transistor T52, which is coupled between the transistors T51 and T56, function as the switch circuit SW1.

Figures 6, 7:
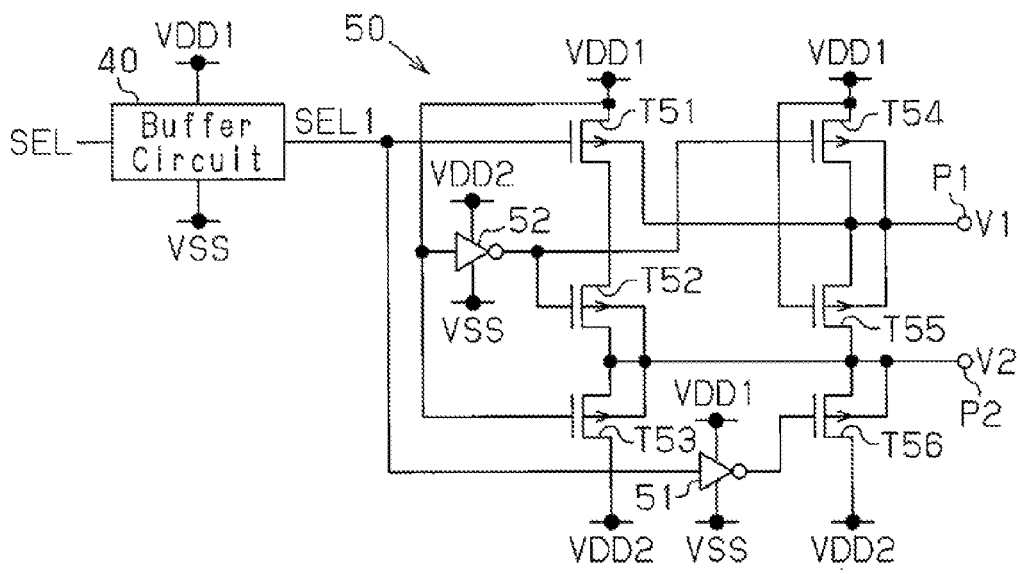
FIG. 6 is a circuit diagram illustrating an example of a control circuit.
FIG. 7 is a table illustrating the operation of the control circuit.

The control circuit 50 generates the first and second control voltages V1 and V2 in accordance with the combinations illustrated in FIG. 7.

A case in which the second high potential power supply VDD2 is activated before the first high potential power supply VDD1, that is, a case in which the first high potential power supply VDD1 is deactivated and the second high potential power supply VDD2 is activated, will first be described. In this case, the first high potential power supply VDD1 has a voltage level of 0V, or the L level, and the second high potential power supply VDD2 has a voltage level of 1.8 V. Thus, in response to the L level first high potential power supply VDD1, the inverter circuit 52 outputs a signal having the H2 level. The H2 level signal deactivates the transistors T52 and T54. Further, the L level high potential power supply VDD1 activates the transistors T53 and T55. Thus, the second control voltage V2 having the voltage level of the second high potential power supply VDD2 is output via the activated transistor T53 from the second output terminal P2. Further, the first control voltage V1 having the voltage level of the second high potential power supply VDD2 is output via the activated transistors T53 and T55 from the first output terminal P1.

Next, a case in which the first high potential power supply VDD1 is activated before the second high potential power supply VDD2, that is, a case in which the first high potential power supply VDD1 is activated and the second high potential power supply VDD2 is deactivated, will be described. In this case, the first high potential power supply VDD1 has a voltage level of 3.3 V, and the second high potential power supply VDD2 has a voltage level of 0 V. In this state, the buffer circuit 40 outputs the control signal SEL1 with the L level due to the function of the initial value setting circuit 41. The L level control signal SEL1 activates the transistor T51. As a result, the first high potential power supply VDD1 is electrically coupled via the transistor T51 to the first terminal (here, the source) of the transistor T52. Further, based on the voltage level of the first high potential power supply VDD1, the transistor T53 is deactivated, and a signal having the L level is output from the inverter circuit 52. The L level signal activates the transistor T54. Thus, the first control voltage V1 having the voltage level of the first high potential power supply VDD1 is output via the activated transistor T54 from the first output terminal P1. The L level signal output from the inverter circuit 52 also activates the transistor T52. Thus, the second control voltage V2 having the voltage level of the first high potential power supply VDD1 is output via the activated transistors T51 and T52 from the second output terminal P2.

Next, a case in which after the first and second high potential power supplies VDD1 and VDD2 are both activated, the buffer circuit 40 is provided with a control signal SEL having the L level to select the first output circuit 10 will be described. In this case, the buffer circuit 40 outputs the control signal SEL1 with the L level. In response to the L level control signal SEL1, the inverter circuit 51 outputs a signal having the H1 level. The H1 level signal deactivates the transistor T56. Further, the L level control signal SEL1 activates the transistor T51. As a result, the first high potential power supply VDD1 is electrically coupled via the activated transistor T51 to the first terminal (here, the source) of the transistor T52. Further, based on the voltage level of the first high potential power supply VDD1, the transistor T53 is deactivated, and a signal having the L level is output from the inverter circuit 52. The L level signal activates the transistor T54. Thus, the first control voltage V1 having the voltage level of the first high potential power supply VDD1 is output via the activated transistor T54 from the first output terminal P1. The L level signal output from the inverter circuit 52 also activates the transistor T52. Thus, the second control voltage V2 having the voltage level of the first high potential power supply VDD1 is output via the activated transistors T51 and T52 from the second output terminal P2.

Next, a case in which after the first and second high potential power supplies VDD1 and VDD2 are both activated, the buffer circuit 40 is provided with a control signal SEL having the H2 or H3 level to select the second output circuit 20 will be described. In this case, the buffer circuit 40 outputs the control signal SEL1 with the H1 level. In response to the H1 level control signal SEL1, the inverter circuit 51 outputs a signal having the L level. The L level signal activates the transistor T56. Thus, the second control voltage V2 having the voltage level of the second high potential power supply VDD2 is output via the activated transistor T56 from the second output terminal P2. Further, in response to the voltage level of the first high potential power supply VDD1, the inverter circuit 52 outputs a signal having the L level. The L level signal activates the transistor T54. Thus, the first control voltage V1 having the voltage level of the first high potential power supply VDD1 is output via the activated transistor T54 from the first output terminal P1.

The operation of the output buffer circuit 1 will now be described with reference to FIGS. 8 to 12.

Figure 8:
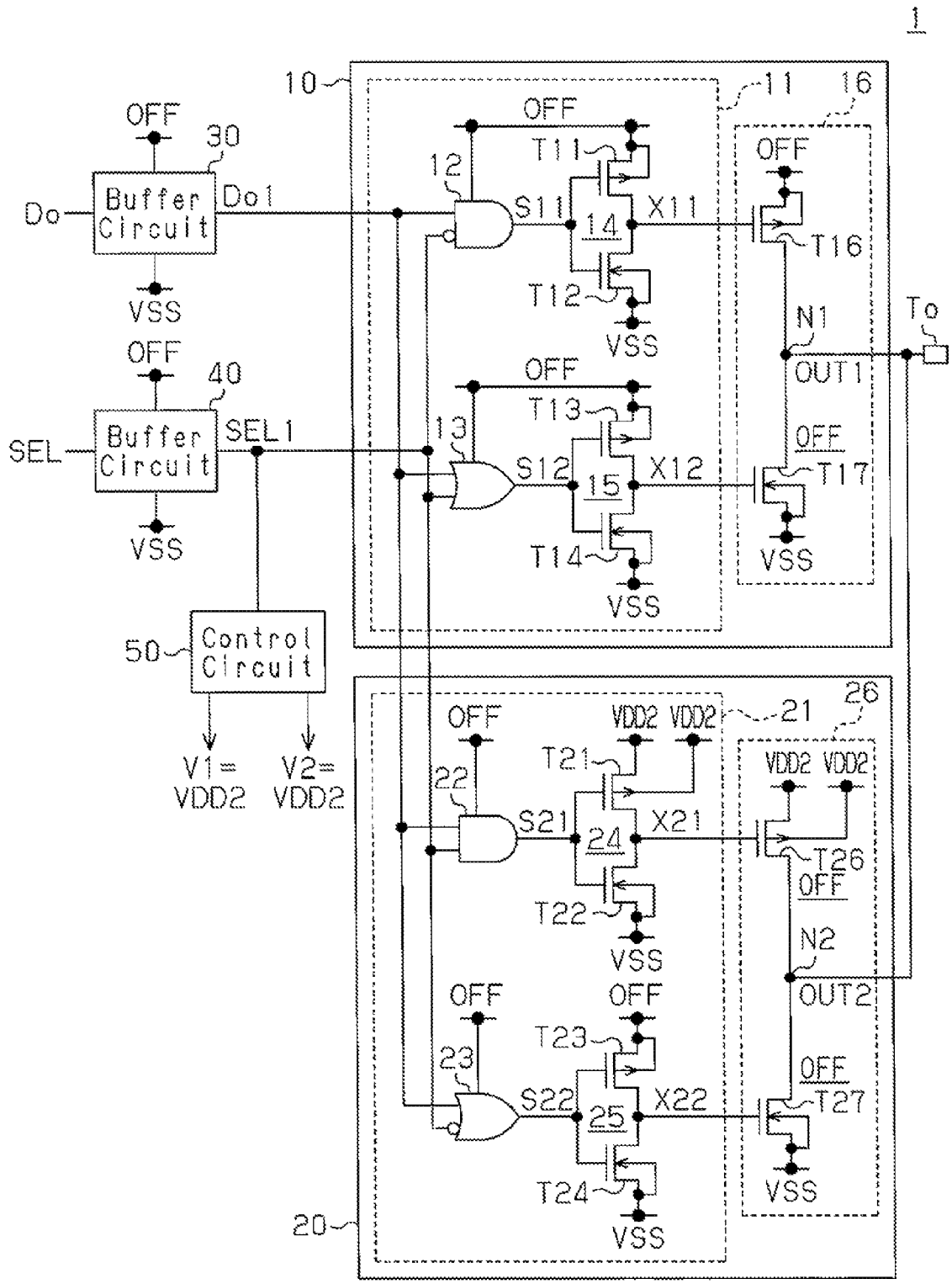
FIG. 8 is a block circuit diagram illustrating the operation of the output buffer circuit.

First, the operation performed when the second high potential power supply VDD2 is activated before the first high potential power supply VDD1 and the first high potential power supply VDD1 is in a deactivated state will be described with reference to FIG. 8. In this case, the control circuit 50 generates the first control voltage V1 with the VDD2 level and the second control voltage V2 with the VDD2 level. Thus, the source and back gate of the output transistor T26 are supplied with the second control voltage V2 having the VDD2 level. Further, the high potential power supply terminal of the inverter circuit 24, which drives the output transistor T26, is supplied with the first control voltage V1 having the VDD2 level and serving as operational power. In FIG. 8, the first control voltage V1 supplied to the inverter circuit 24 and the second control voltage V2 supplied to the output transistor T26 are indicated as "VDD2", and the first high potential power supply VDD1 in the deactivated state is indicated as "OFF".

The buffer circuits 11, 30, and 40, which are actuated by the first high potential power supply VDD1, are all inoperable. Here, in the first output circuit 10, the inverted signals X11 and X12 output from the inverter circuits 14 and 15 have the L level. Thus, the output transistor T16 is activated, and the output transistor T17 is deactivated.

In the second output circuit 20, the inverted signal X22 having the L level is output from the inverter circuit 25. Thus, the output transistor T27 is deactivated. Further, the logic circuit 22 outputs the output signal S21 with the L level. Thus, the inverted signal X21 having the VDD2 level is provided from the inverter circuit 24 to the gate of the output transistor T26. In this state, the back gate of the output transistor T26 is supplied with the voltage of the VDD2 level. In this case, the gate voltage and back gate voltage of the output transistor T26 are set at the VDD2 level. This deactivates the output transistor T26. Thus, current is prevented from flowing from the second high potential power supply VDD2 via the output transistor T26 toward the deactivated first high potential power supply VDD1.

Figure 9:
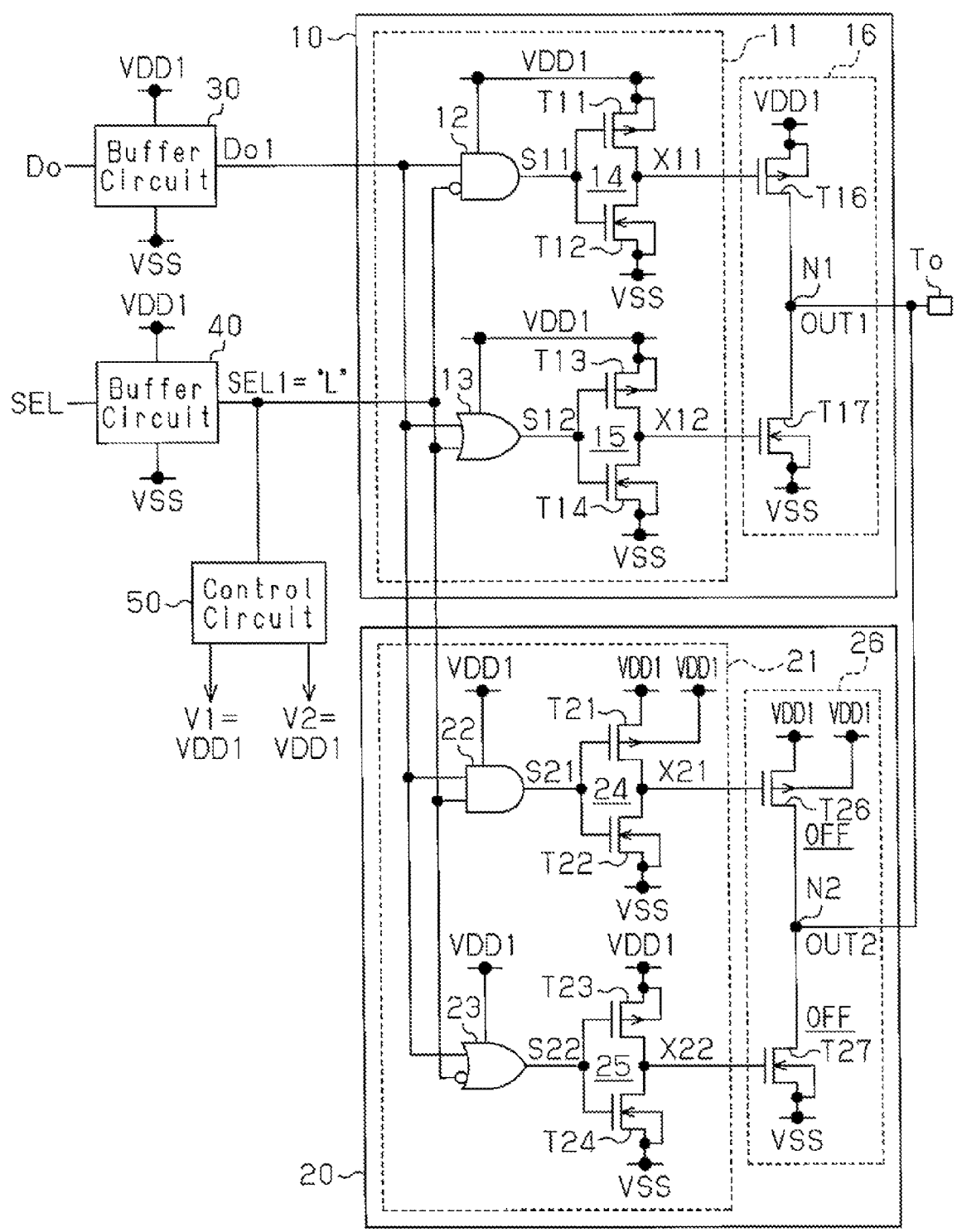
FIG. 9 is a block circuit diagram illustrating the operation of the output buffer circuit.

The operation performed when the first high potential power supply VDD1 is activated before the second high potential power supply VDD2 and the second high potential power supply VDD2 is in a deactivated state will be described with reference to FIG. 9. In this case, the control circuit 50 generates the first control voltage V1 with the VDD1 level and the second control voltage V2 with the VDD1 level. Thus, the source and back gate of the output transistor T26 are supplied with the second control voltage V2 having the VDD1 level. Further, the high potential power supply terminal of the inverter circuit 24 is supplied with the first control voltage V1 having the VDD1 level and serving as operational power. In FIG. 9, the first control voltage V1 supplied to the inverter circuit 24 and the second control voltage V2 supplied to the output transistor T26 are indicated as "VDD1".

In this state, the buffer circuit 40 outputs the control signal SEL1 with the L level due to the functions of the initial value setting circuit 41 (refer to FIG. 3). In response to the L level control signal SEL1, the logic circuit 22 outputs the output signal S21 with the L level. Thus, the inverter circuit 24 provides the gate of the output transistor T26 with the inverted signal X21 having the VDD1 level. In this state, the back gate of the output transistor T26 is supplied with the voltage of the VDD1 level. In this case, the gate voltage and back gate voltage of the output transistor T26 are set at the VDD1 level. This deactivates the output transistor T26. Thus, when the output transistor T16 of the first output circuit 10 is activated, current is prevented from flowing from the high potential power supply VDD1 to the power supply terminal of the output driver 26 in the second output circuit 20.

Figure 10:
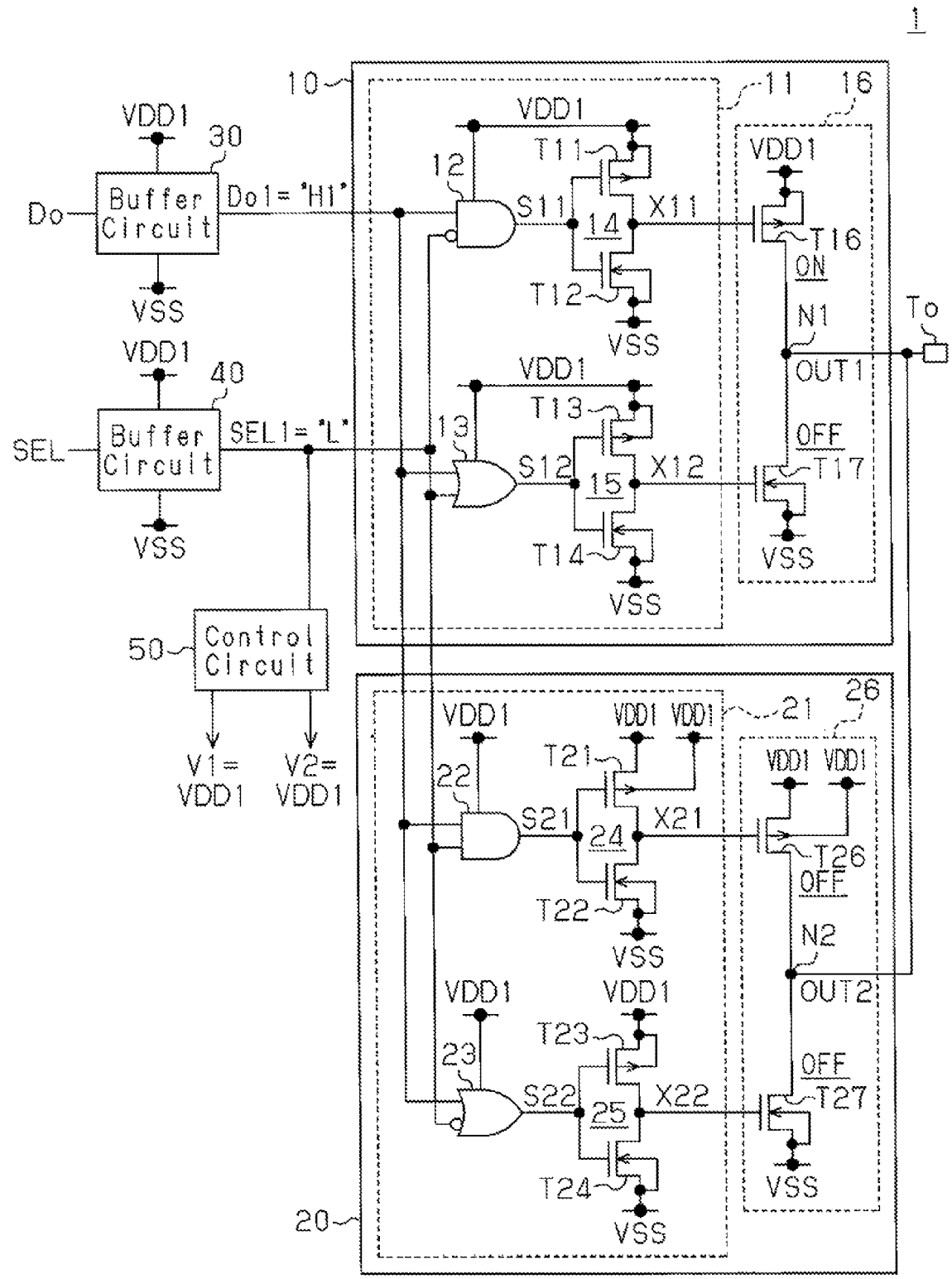
FIG. 10 is a block circuit diagram illustrating the operation of the output buffer circuit.

The operation performed when the buffer circuit 40 receives a control signal SEL having an L level in a state in which the first and second high potential power supplies VDD1 and VDD2 are both activated will now be described with reference to FIG. 10. Here, the buffer circuit 30 receives a signal Do having an H2 level or an H3 level. In this case, the control circuit 50 generates the first control voltage V1 with the VDD1 level and the second control voltage V2 with the VDD1 level. Thus, the source and back gate of the output transistor T26 are supplied with the second control voltage V2 having the VDD1 level. Further, the high potential power supply terminal of the inverter circuit 24 is supplied with the first control voltage V1 having the VDD1 level and serving as operational power. In FIG. 10, the first control voltage V1 supplied to the inverter circuit 24 and the second control voltage V2 supplied to the output transistor T26 are indicated as "VDD1".

In response to the control signal SEL1 having the L level and the signal Do1 having the H1 level, the logic circuits 12 and 13 respectively generate output signals S11 and S12 having the H1 level. Accordingly, the inverter circuits 14 and 15 respectively output inverted signals X11 and X12 having the L level. This activates the output transistor T16 and deactivates the output transistor T17. As a result, an output signal OUT1 having the H1 level is output from the output node N1 between the output transistors T16 and T17.

In this state, based on a control signal SEL1 having the H1 level, in the second output circuit 20, the logic circuit 22 generates an output signal S21 having the L level, and the logic circuit 23 generates an output signal S22 having the H1 level. In response to the L level output signal S21, the inverter circuit 24 outputs an inverted signal X21 having the H1 level.

In response to the H1 level output signal S22, the inverter circuit 25 outputs an inverted signal X22 having the L level. Thus, the output transistors T26 and T27 are both deactivated. In this state, the back gate of the output transistor T26 is supplied with the second control voltage V2 having the VDD1 level, which corresponds to the voltage level of the output signal OUT1 provided to the drain of the output transistor T26. Thus, current is prevented from flowing from the output node N1 of the first output circuit 10 via the output transistor T26 toward the power supply terminal of the output driver 26.

In this example, the second output circuit 20 is supplied with the first high potential power supply VDD1, which serves as operational power. Thus, a current path is not formed from the first high potential power supply (here, the first high potential power supply VDD1) to the second high potential power supply lower than the first high potential power supply (here, the second high potential power supply VDD2).

Figure 11:
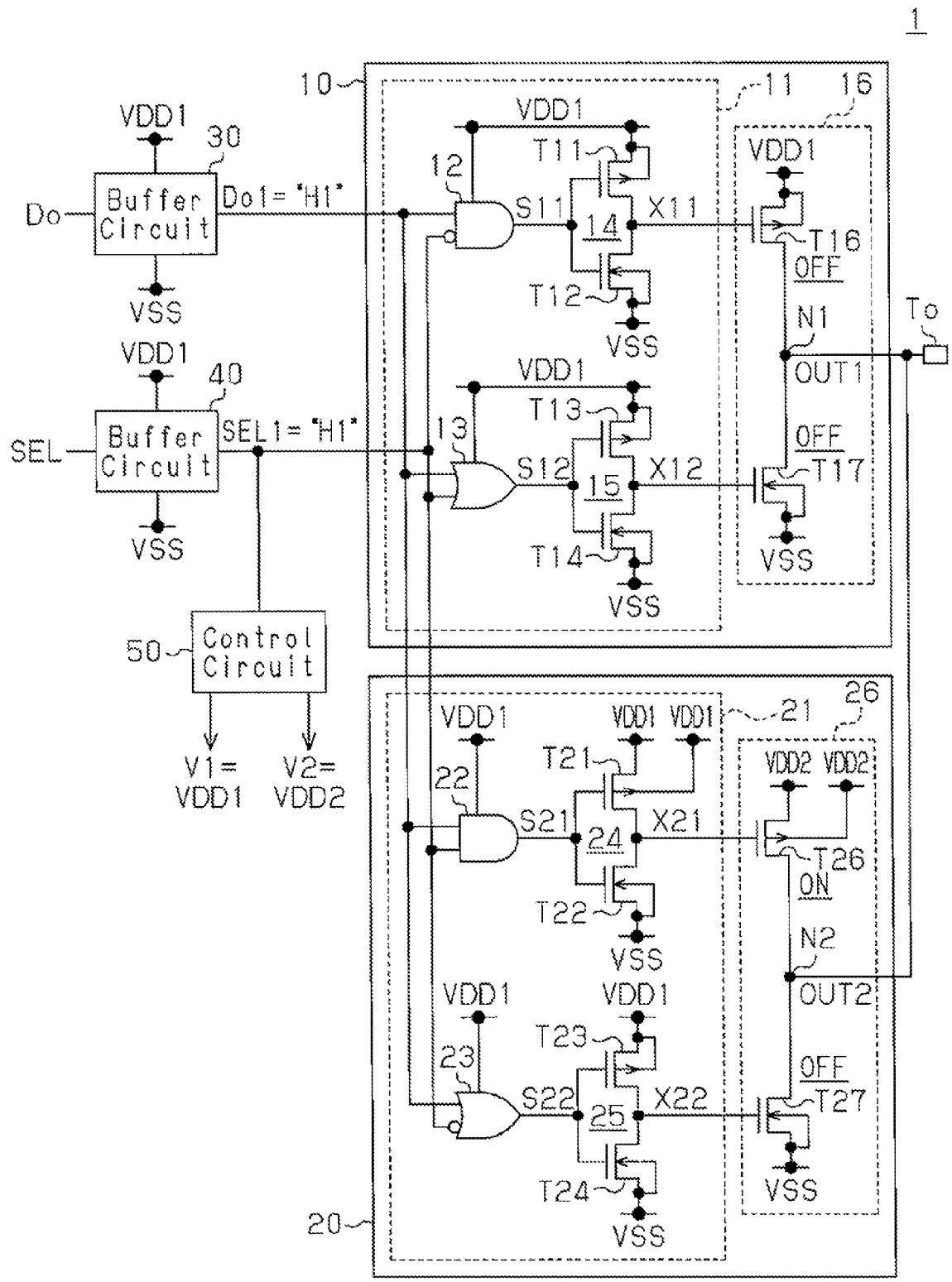
FIG. 11 is a block circuit diagram illustrating the operation of the output buffer circuit.

The operation performed when the buffer circuit 40 receives a control signal SEL having the H2 level or the H3 level in a state in which the first and second high potential power supplies VDD1 and VDD2 are both activated will now be described with reference to FIG. 11. Here, the buffer circuit 30 receives a signal Do having the H2 level or the H3 level. In this case, the control circuit 50 generates the first control voltage V1 with the VDD1 level and the second control voltage V2 with the VDD2 level. Thus, the source and back gate of the output transistor T26 are supplied with the second control voltage V2 having the VDD2 level. Further, the high potential power supply terminal of the inverter circuit 24 is supplied with the first control voltage V1 having the VDD1 level and serving as operational power. In FIG. 11, the first control voltage V1 supplied to the inverter circuit 24 is indicated as "VDD1", and the second control voltage V2 supplied to the output transistor T26 is indicated as "VDD2".

When the control signal SEL1 has the H1 level, the logic circuit 12 outputs an output signal S11 having the L level, and the logic circuit 13 outputs an output signal S12 having the H1 level. In response to the L level output signal S11, the inverter circuit 14 outputs an inverted signal X11 having the H1 level. In response to the H1 level output signal S12, the inverter circuit 15 outputs an inverted signal X12 having the L level. Thus, the output transistors T16 and T17 are both deactivated.

In the second output circuit 20, based on the control signal SEL1 having the H1 level and the signal Do1 having the H1 level, the logic circuits 22 and 23 respectively generate output signals S21 and S22 having the H1 level. Accordingly, the inverter circuits 24 and 25 respectively output inverted signals X21 and X22 having the L level. This activates the output transistor T26 and deactivates the output transistor T27. As a result, an output signal OUT2 having an H2 level is output from the output node N2 between the output transistors T26 and T27.

In this state, the back gate of the output transistor T26 is supplied with the second control voltage V2 having the VDD2 level, which corresponds to the potential at the first terminal (here, the source) of the output transistor T26. Accordingly, the voltage between source and back gate of the output transistor T26 is 0 V. This minimizes variations in the characteristics of the output transistor T26 when the second output circuit 20 is actuated.

Figure 12:
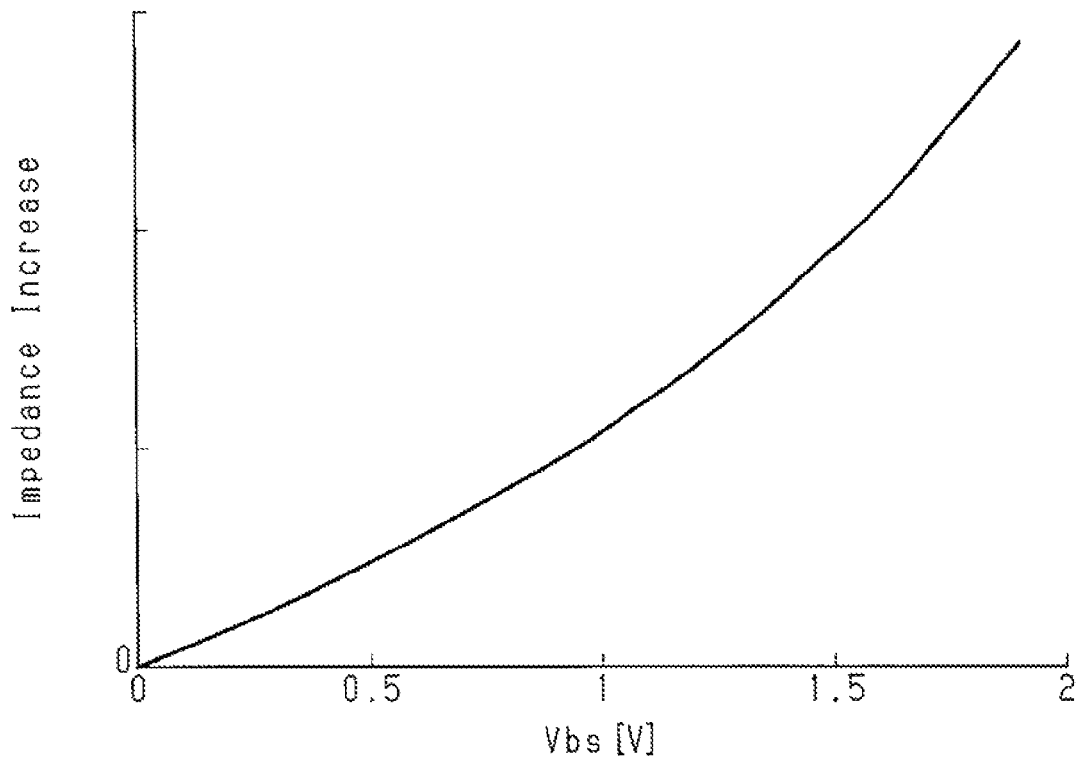
FIG. 12 is a graph illustrating the increase in impedance relative to the voltage between the source and back gate of a transistor.

For example, in the output buffer circuit 2 of the related art illustrated in FIG. 1, the source potential of the output transistor T91 has the VDD2 level, and the back gate voltage of the output transistor T91 has the VDD1 level. In this case, a source-back gate voltage Vbs is VDD1-VDD2. Referring to FIG. 12, the output impedance (characteristics) of the output transistor T91 increases as the source-back gate voltage Vbs increases, that is, as the potential difference between the first and second high potential power supplies VDD1 and VDD2 increases. The characteristics of the output transistor T91 are adversely affected as the output impedance varies.

In contrast, with the output transistor T26 of the present embodiment, the source voltage and the back gate voltage are set with the second high potential power supply VDD2 so that the source-back gate voltage Vbs is 0 V. Thus, as apparent from FIG. 12, the output impedance of the output transistor T26 may be minimized. This suppresses deterioration of the characteristics of the output transistor T26. In FIG. 12, the vertical axis indicates increases in the output impedance when the source-back gate voltage Vbs varies from the output impedance when the source-back gate voltage Vbs is 0 V.

The above embodiment has the advantages described below.

(1) When the second high potential power supply VDD2 is activated before the first high potential power supply VDD1, that is, when the second high potential power supply VDD2 is activated and the first high potential power supply VDD1 is deactivated, the gate voltage and the back gate voltage of the output transistor T26 in the second output circuit 20 are set to the VDD2 level. This deactivates the output transistor T26, which is a P-channel MOS transistor. Thus, current is prevented from flowing from the second high potential power supply VDD2 via the output transistor T26 toward the deactivated first high potential power supply VDD1. Accordingly, even when the second high potential power supply VDD2 is activated before the first high potential power supply VDD1, power variations do not occur. Thus, there is no need to impose a limitation on the order of activation of the power supplies.

(2) When the first high potential power supply VDD1 is activated before the second high potential power supply VDD2, that is, when the first high potential power supply VDD1 is activated and the second high potential power supply VDD2 is deactivated, the control signal SEL1 is set to the L level to select the second output circuit 20. In this case, the gate voltage and the back gate voltage of the output transistor T26 of the second output circuit 20 are set to the VDD1 level. This deactivates the output transistor T26. Thus, when the output transistor T16 of the first output circuit 10 is activated, current is prevented from flowing from the first high potential power supply VDD1 to the power supply terminal of the output driver 26 of the second output circuit 20. Accordingly, even when the first high potential power supply VDD1 is activated before the second high potential power supply VDD2, power variations do not occur. Thus, there is no need to impose a limitation on the order of activation of the power supplies.

(3) As described in advantages (1) and (2), even when one of the first high potential power supply VDD1 and the second high potential power supply VDD2 is activated before the other one, inflow current is not generated in the output buffer circuit 1. Thus, there is no limitation to the order of activation of the power supplies. This allows for omission of circuits dedicated to power supply control.

(4) When the second output circuit 20 is selected based on a control signal SEL1 having the H1 level, both of the back gate voltage of the output transistor T26 and the source voltage of the output transistor T26 are set at the VDD2 level. That is, the source-back gate voltage Vbs of the output transistor T26 is 0 V. This minimizes the output impedance and reduces variations in the characteristics of the output transistor T26. Thus, operations may be performed at high speeds and lower voltages.

It should be apparent to those skilled in the art that the aforementioned embodiments may be embodied in many other forms without departing from the spirit or scope of the invention. Particularly, it should be understood that the aforementioned embodiments may be embodied in the following forms.

Figure 13:
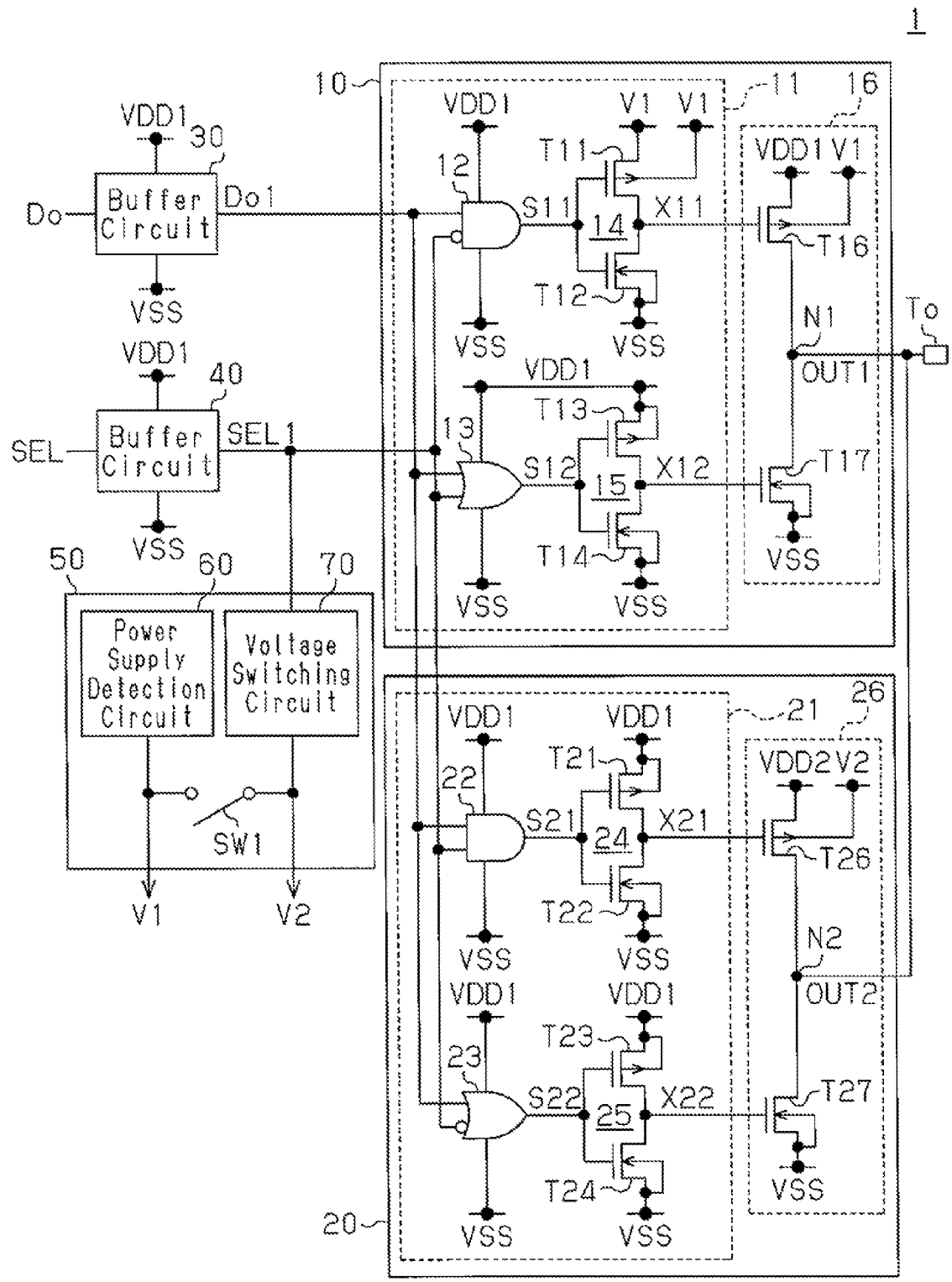
FIG. 13 is a block circuit diagram illustrating a modification of the output buffer circuit.

Referring to FIG. 13, the first control voltage V1 may be supplied to the back gate of the output transistor T16 in the first output circuit 10, and the first control voltage V1 may be supplied as operational power supply voltage to the inverter circuit 14 which drives the output transistor T16. Further, the first terminal (e.g., source) of the output transistor T26 in the second output circuit 20 may be coupled to the second high potential power supply VDD2, and the back gate of the output transistor T26 may be supplied with the second control voltage V2. In this case, the high potential power supply terminal of the inverter circuit 24 which drives the output transistor T26 may be coupled to the first high potential power supply VDD1.

Figure 14:
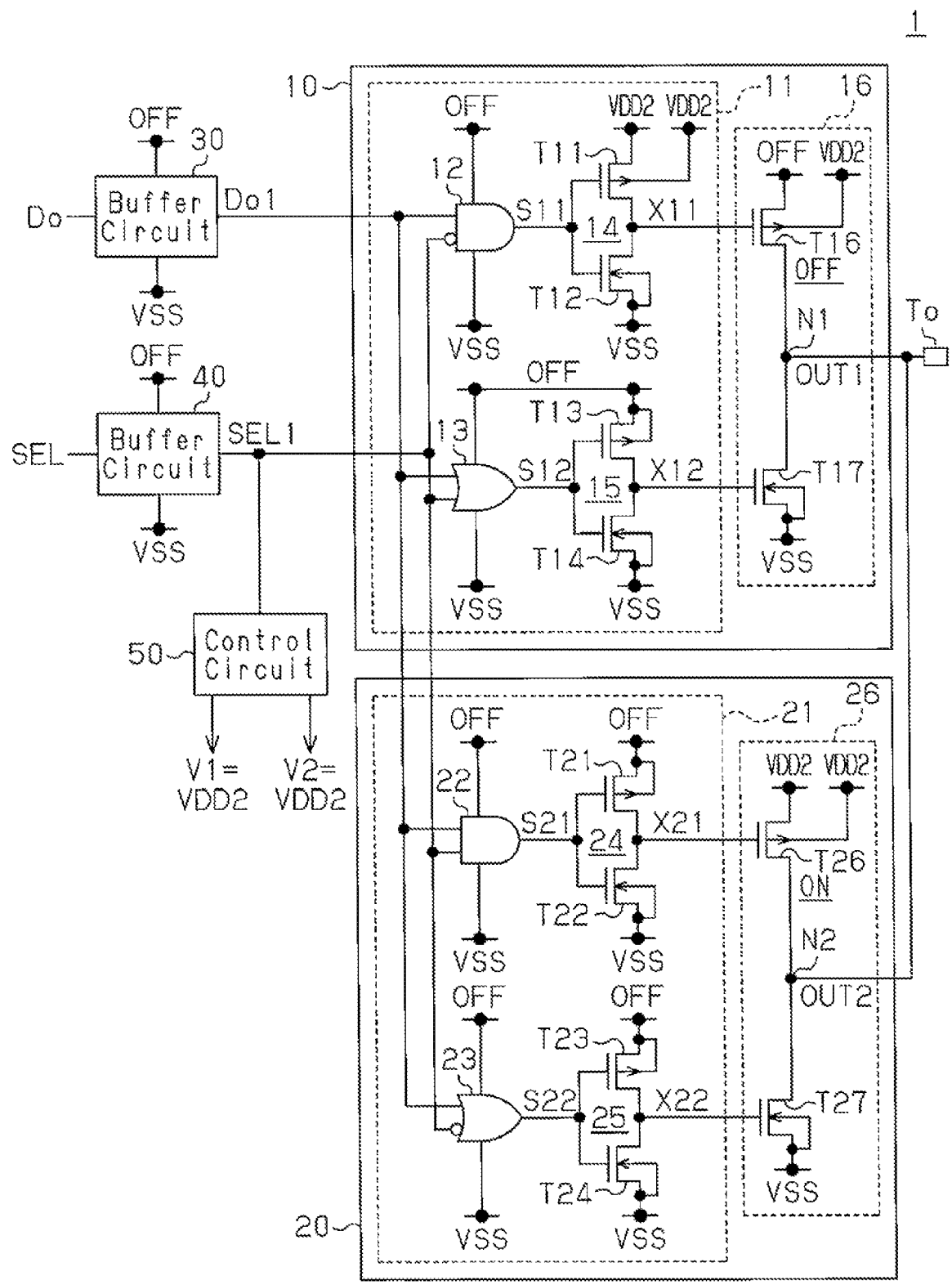
FIG. 14 is a block circuit diagram illustrating the operation of a modification of the output buffer circuit.

Even in such a structure, as illustrated in FIG. 14, when the second high potential power supply VDD2 is activated before the first high potential power supply VDD1, the gate voltage and back gate voltage of the output transistor T16 are set to the VDD2 level. That is, an inverted signal X11 having the VDD2 level is provided to the gate of the output transistor T16 from the inverter circuit 14 based on the L level output signal S11, and the first control voltage V1 having the VDD2 level is provided to the back gate of the output transistor T16. This deactivates the output transistor T16. Thus, even when the output transistor T26 of the second output circuit 20 is activated, current is prevented from flowing from the second high potential power supply VDD2 via the output transistor T16 toward the deactivated first high potential power supply VDD1.

Figure 15:
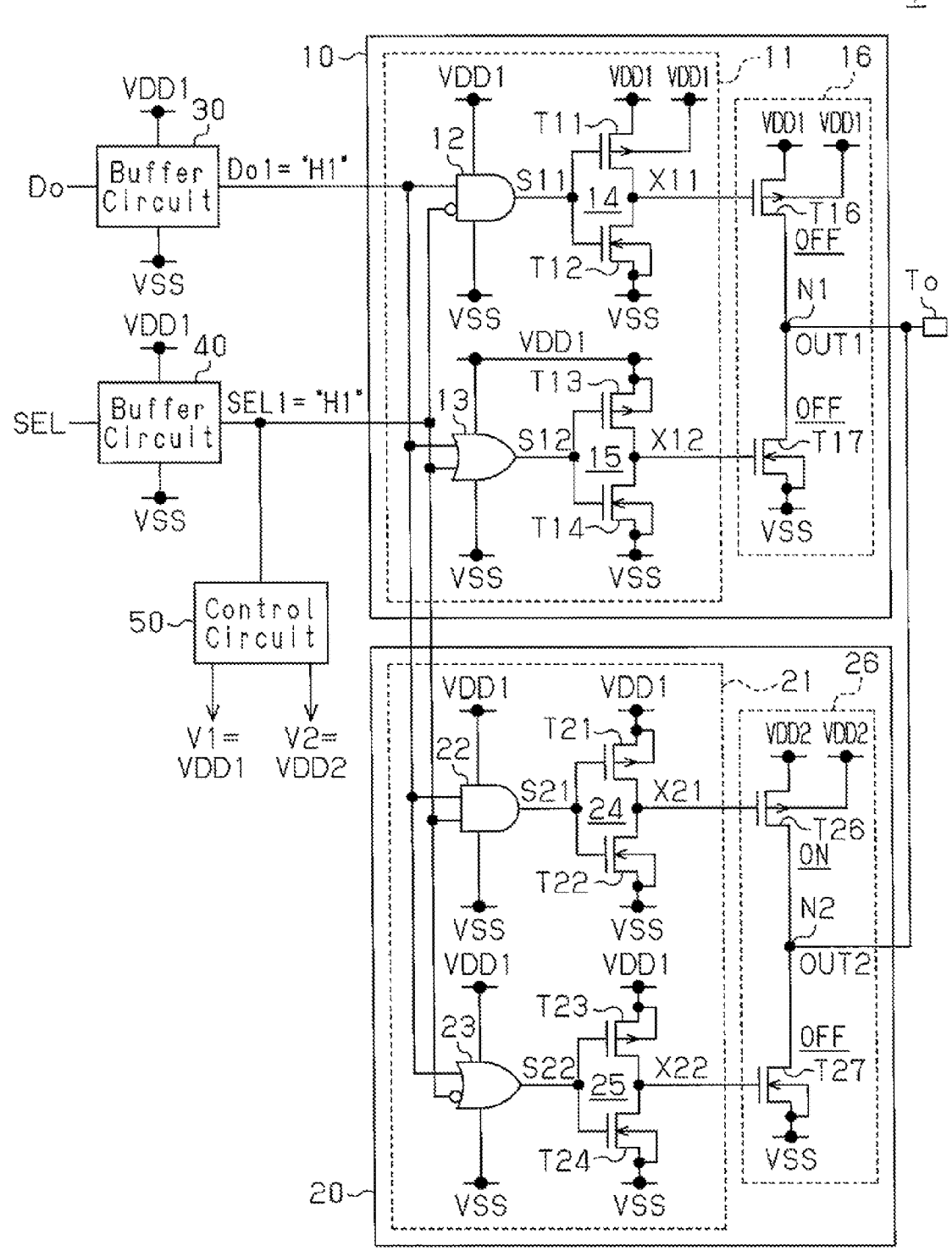
FIG. 15 is a block circuit diagram illustrating the operation of a modification of the output buffer circuit.

Further, in the structure of FIG. 14, when the second output circuit 20 is actuated in response to a control signal SEL1 having the H1 level, as illustrated in FIG. 15, the source voltage and back gate voltage of the output transistor T26 are set at the VDD2 level. This minimizes variations in the characteristics of the output transistor T26. Further, when the first output circuit 10 is actuated in response to a control signal SEL1 having the L level, the source voltage and back gate voltage of the output transistor T16 are set to the level of the first high potential power supply VDD1. This minimizes variations in the characteristics of the output transistor T16.

Figure 16:
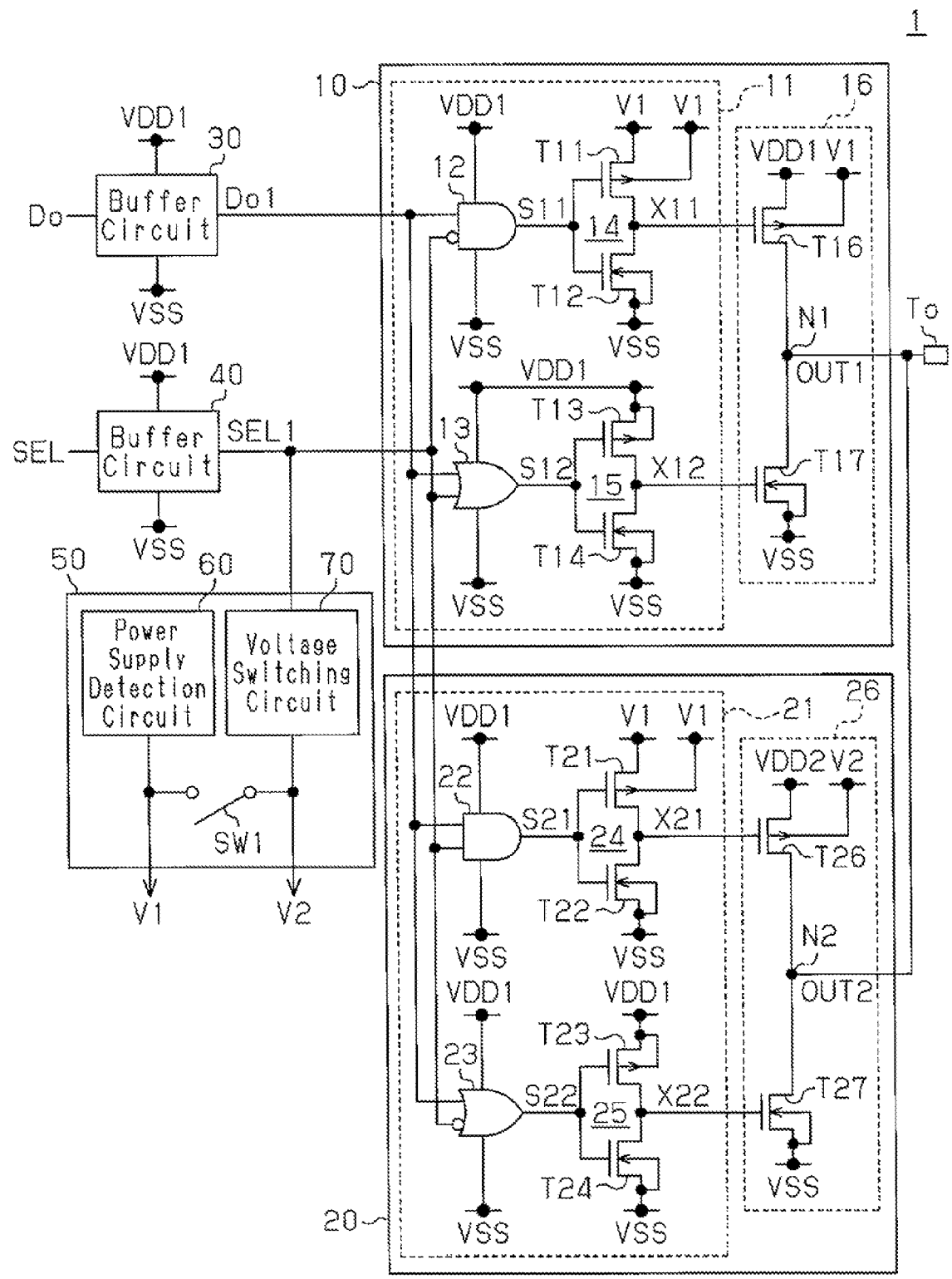
FIG. 16 is a block circuit diagram illustrating a modification of the output buffer circuit.

Referring to FIG. 16, the first control voltage V1 may be supplied to the back gate of the output transistor T16 in the first output circuit 10, and the first control voltage V1 may be supplied as operational power supply voltage to the inverter circuit 14 which drives the output transistor T16. Further, the first terminal (e.g., source) of the output transistor T26 in the second output circuit 20 may be coupled to the second high potential power supply VDD2, and the back gate of the output transistor T26 may be supplied with the second control voltage V2. In this case, the first control voltage V1 may be supplied as operational power supply voltage to the high potential power supply terminal of the inverter circuit 24 which drives the output transistor T26.

Figure 17:
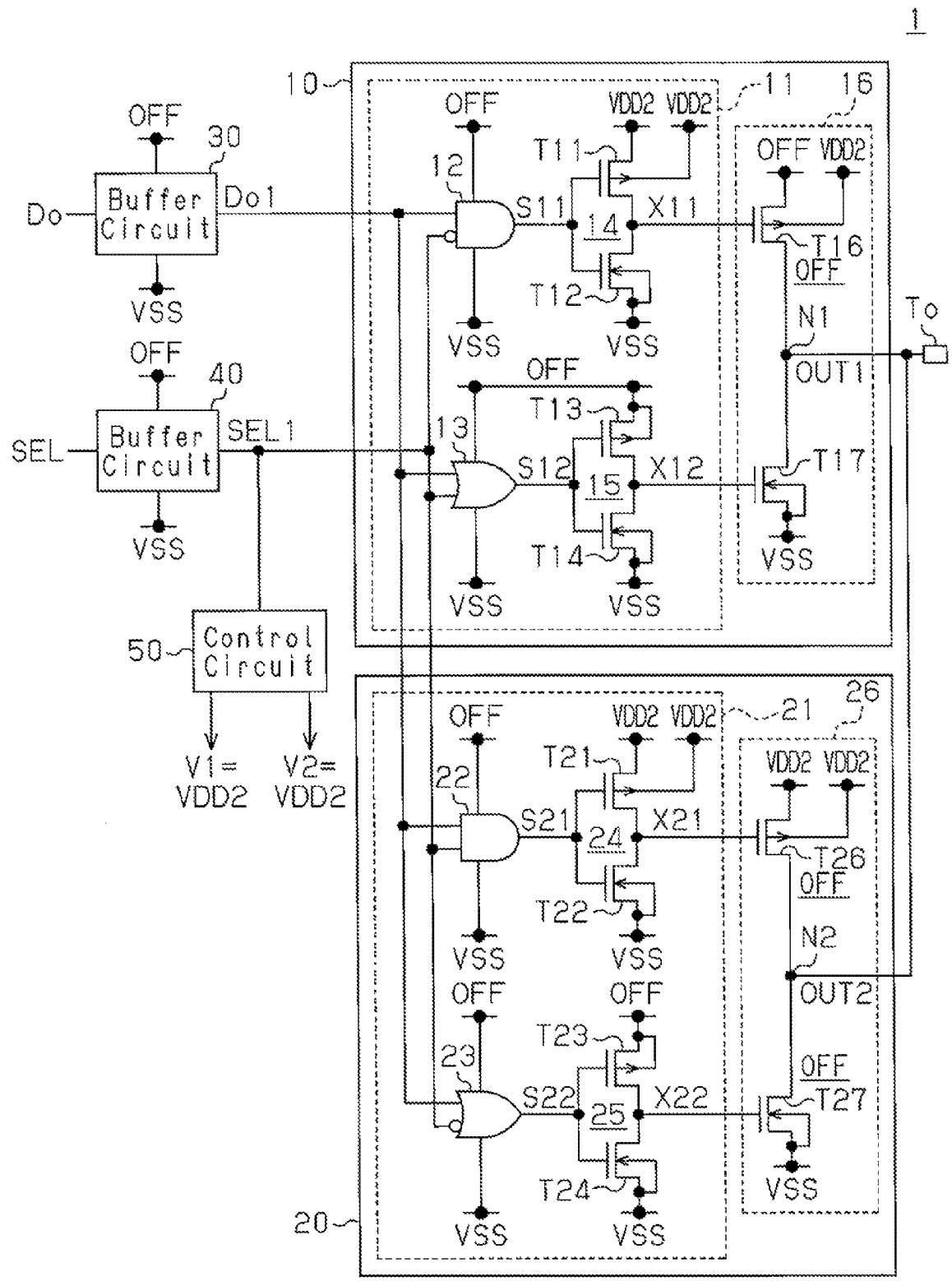
FIG. 17 is a block circuit diagram illustrating the operation of a modification of the output buffer circuit.

Even in such a structure, as illustrated in FIG. 17, when the second high potential power supply VDD2 is activated before the first high potential power supply VDD1, the gate voltage and back gate voltage of the output transistor T16 as well as the gate voltage and back gate voltage of the output transistor T26 are set to the VDD2 level. This deactivates both of the output transistors T16 and T26. Thus, current is prevented from flowing from the second high potential power supply VDD2 toward the first high potential power supply VDD1.

In this manner, when the second high potential power supply VDD2 is activated and the first high potential power supply VDD1 is deactivated, by setting the gate voltage and back gate voltage of at least one of the output transistor T16 and the output transistor T26 to the VDD2 level, advantage (1) of the above embodiment may be obtained.

In the above embodiment, when the first high potential power supply VDD1 is activated before the second high potential power supply VDD2, the initial value setting circuit 41 sets the control signal SEL1 to the L level. Instead, in such a case, the initial value setting circuit 41 may set the control signal SEL1 to, for example, the H1 level. Here, the gate voltage and back gate voltage of the output transistor T16 are set to the VDD1 level like the first output circuit 10 illustrated in FIGS. 2, 13, and 16. In this case, the logic circuit 12 outputs an output signal S11 having an L level based on the H1 level control signal SEL1, and the inverter circuit 14 outputs an inverted signal X11 having the H1 level. This deactivates the output transistor T16. Thus, even when the output transistor T26 of the second output circuit 20 is activated, current is prevented from flowing from the first high potential power supply VDD1 toward the power supply terminal of the output driver 16 in the first output circuit 10.

In this manner, advantage (2) of the above embodiment may be obtained by setting the gate voltage and back gate voltage of the high potential output transistor (output transistor T16 or output transistor T26) to the VDD1 level in the output circuit (first output circuit 10 or second output circuit 20) selected in accordance with the initial value of the control signal SEL1.

In the above embodiment, if the control signal SEL1 is set at the L level or the H1 level when the first high potential power supply VDD1 is activated before the second high potential power supply VDD2, the initial value setting circuit 41 may be omitted. In this case, like the output buffer circuit 1 illustrated in FIGS. 2, 13, and 16, the gate voltages and back gate voltages of both of the output transistors T16 and T26 are set at the level of the first high potential power supply VDD1 when the first high potential power supply VDD1 is activated first. As a result, when the control signal SEL1 is set to the L level or the H1 level, one of the output transistors T16 and T26 is deactivated. This prevents current from flowing from the first high potential power supply VDD1 toward the second high potential power supply VDD2.

The voltage switching circuit 70 and the switch circuit SW1 may be omitted from the control circuit 50 of the above embodiment. In this case, the control circuit 50 includes the power supply detection circuit 60 that generates the first control voltage V1. Further, for example, in the output buffer circuit 1 illustrated in FIG. 2, instead of the second control voltage V2, the second high potential power supply VDD2 may be coupled to the source of the output transistor T26, and the first control voltage V1 may be supplied to the back gate of the output transistor T26. Such a structure also obtains advantage (1) of the above embodiment.

Figure 18:
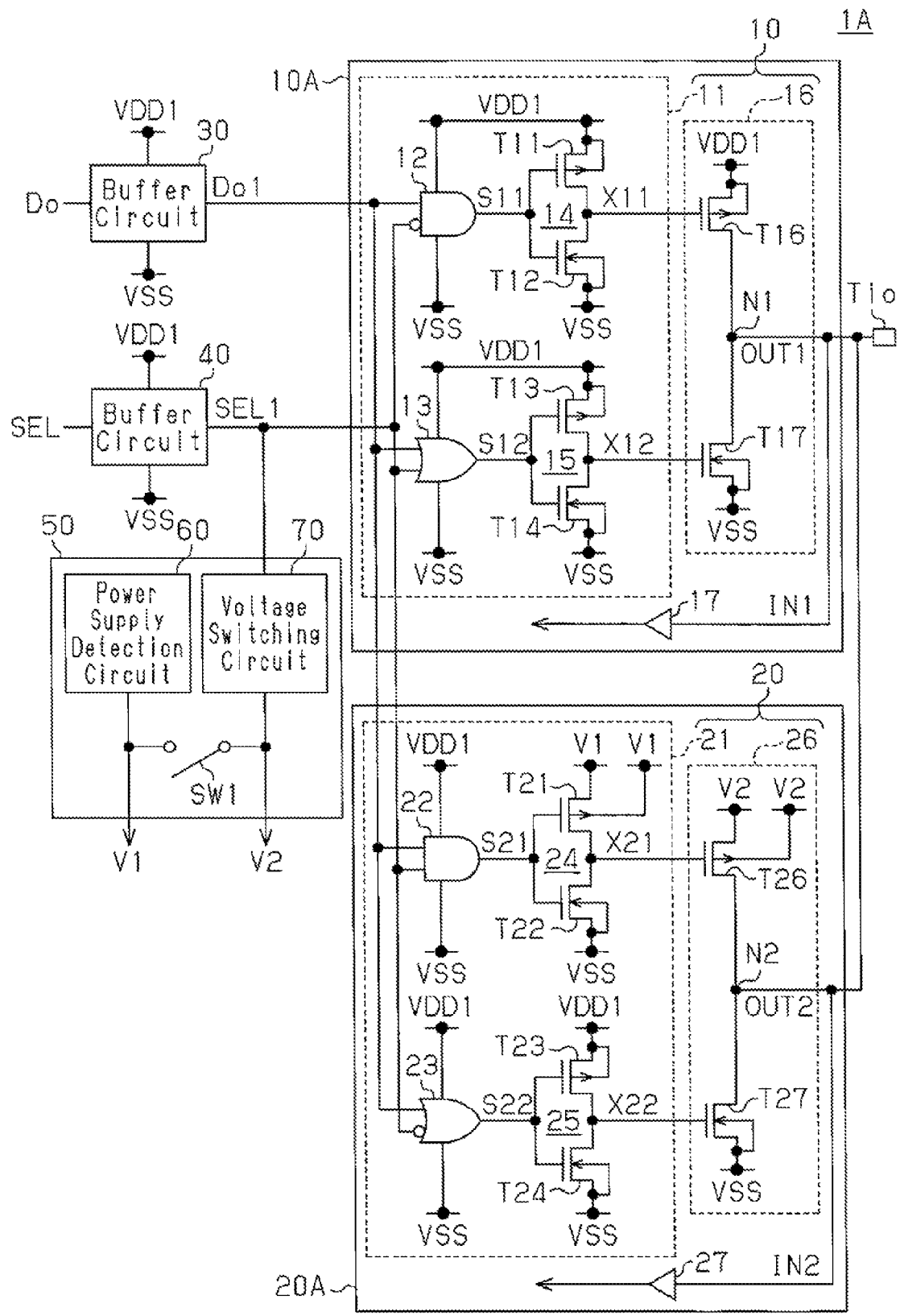
FIG. 18 is a block circuit diagram illustrating an input/output buffer circuit.

In the above embodiment, the output buffer circuit 1 includes the first output circuit 10 and the second output circuit 20. However, there is no limitation to such a configuration. For example, as illustrated in FIG. 18, the present disclosure may also be directed to an input/output buffer circuit 1A that includes a first input/output circuit 10A and a second input/output circuit 20A. In addition to the first output circuit 10, which includes the buffer circuit 11 and the output driver 16, the first input/output circuit 10A includes a first input circuit 17, which includes an input terminal coupled to the output node N1 (input/output terminal Tio) of the first output circuit 10. In the first input/output circuit 10A, a signal IN1 input to the input/output terminal Tio during an input operation is supplied via the first input circuit 17 to an internal circuit. Further, in addition to the second output circuit 20, which includes the buffer circuit 21 and the output driver 26, the second input/output circuit 20A includes a second input circuit 27, which includes an input terminal coupled to the output node N2 (input/output terminal Tio) of the second output circuit 20. In the second input/output circuit 20A, a signal IN2 input to the input/output terminal Tio during an input operation is supplied via the second input circuit 27 to an internal circuit. During such an input operation, the output nodes N1 and N2 are set to a state of high impedance. Thus, it is preferable that the back gate voltages of the output transistors T16 and T26 be set to the level of the first high potential power supply VDD1.

All examples and conditional language recited herein are intended for pedagogical purposes to aid the reader in understanding the principles of the invention and the concepts contributed by the inventor to furthering the art, and are to be construed as being without limitation to such recited examples and conditions, nor does the organization of such examples in the specification relate to an illustration of the superiority and inferiority of the invention. Although the embodiment(s) of the present invention(s) has (have) been described in detail, it should be understood that the various changes, substitutions, and alterations could be made hereto without departing from the spirit and scope of the invention.

The invention claimed is:

1. An output buffer circuit comprising:
a first output circuit that outputs a first signal having a voltage level of a first high potential power supply or a low potential power supply, wherein the first output circuit includes a first output transistor at a high potential side, and the first output transistor includes a gate and a back gate;
a second output circuit that outputs a second signal having a voltage level of a second high potential power supply, which is lower than the first high potential power supply, or the low potential power supply, wherein an output terminal of the second output circuit is coupled to an output terminal of the first output circuit and includes a second output transistor at a high potential side, and the second output transistor includes a gate and a back gate; and
a control circuit that sets the gate and back gate of at least one of the first output transistor and the second output transistor to the voltage level of the second high potential power supply when the first high potential power supply is deactivated and the second high potential power supply is activated.

2. The output buffer circuit according to claim 1, wherein:
the control circuit sets the back gate of the second output transistor to the voltage level of the second high potential power supply when the second signal is output from the second output circuit; and
the control circuit sets the back gate of the second output transistor to the voltage level of the first high potential power supply when the first signal is output from the first output circuit.

3. The output buffer circuit according to claim 1, wherein the control circuit sets the gate and back gate of each of the first output transistor and the second output transistor to the voltage level of the first high potential power supply when the first high potential power supply is activated and the second high potential power supply is deactivated.

4. The output buffer circuit according to claim 1, further comprising a setting circuit that generates a control signal for selectively actuating either one of the first output circuit and the second output circuit when the first high potential power supply is activated and the second high potential power supply is deactivated.

5. The output buffer circuit according to claim 1, further comprising:
   a first buffer circuit that drives the first output transistor; and
   a second buffer circuit that drives the second output transistor, wherein:
   the control circuit includes a power supply detection circuit that detects activation of the first high potential power supply and the second high potential power supply and generates a first control voltage;
   the power supply detection circuit sets the first control voltage to the voltage level of the first high potential power supply when the first high potential power supply is activated and the second high potential power supply is deactivated;
   the power supply detection circuit sets the first control voltage to the voltage level of the second high potential power supply when the first high potential power supply is deactivated and the second high potential power supply is activated;
   the first control voltage is supplied to the back gate of at least one of the first output transistor and the second output transistor;
   the first control voltage is supplied as operational power supply to the first buffer circuit when the back gate of the first output transistor is supplied with the first control voltage; and
   the first control voltage is supplied as operational power supply to the second buffer circuit when the back gate of the second output transistor is supplied with the first control voltage.

6. The output buffer circuit according to claim 1, further comprising:
   a first buffer circuit that drives the first output transistor; and
   a second buffer circuit that drives the second output transistor, wherein
   the control circuit includes:
      a power supply detection circuit that detects activation of the first high potential power supply and the second high potential power supply and generates a first control voltage, wherein
         the power supply detection circuit sets the first control voltage to the voltage level of the first high potential power supply when the first high potential power supply is activated and the second high potential power supply is deactivated, and
         the power supply detection circuit sets the first control voltage to the voltage level of the second high potential power supply when the first high potential power supply is deactivated and the second high potential power supply is activated;
      a voltage switching circuit that generates a second control voltage based on a control signal that selectively actuates one of the first output circuit and the second output circuit, wherein
         the voltage switching circuit sets the second control voltage to the voltage level of the first high potential power supply when the first output circuit is selected by the control signal, and
         the voltage switching circuit sets the second control voltage to the voltage level of the second high potential power supply when the second output circuit is selected by the control signal; and
      a switch circuit that couples an output terminal of the power supply detection circuit and an output terminal of the voltage switching circuit when one of the first high potential power supply and the second high potential power supply is activated and the other is deactivated, wherein
   the second control voltage is supplied to the back gate of the second output transistor, and
   the first control voltage is supplied as operational power supply to the second buffer circuit, or supplied as operational power supply to the first buffer circuit with the back gate of the first output transistor supplied with the first control voltage.

7. The output buffer circuit according to claim 5, wherein the power supply detection circuit sets the first control voltage to the voltage level of the first high potential power supply when the first high potential power supply and the second high potential power supply are both activated.

8. The output buffer circuit according to claim 6, wherein the power supply detection circuit sets the first control voltage to the voltage level of the first high potential power supply when the first high potential power supply and the second high potential power supply are both activated.

9. An output buffer circuit comprising:
   a first output circuit that outputs a first signal having a voltage level of a first high potential power supply or a low potential power supply;
   a second output circuit that outputs a second signal having a voltage level of a second high potential power supply, which is lower than the first high potential power supply, or the low potential power supply, wherein an output terminal of the second output circuit is coupled to an output terminal of the first output circuit and the second output circuit includes an output transistor at a high potential side, and the output transistor includes a gate and a back gate; and
   a control circuit that sets the gate and back gate of the output transistor of the second output circuit to the voltage level of the second high potential power supply when the first high potential power supply is deactivated and the second high potential power supply is activated.

* * * * *